United States Patent
Muth

(10) Patent No.: US 6,720,233 B2
(45) Date of Patent: *Apr. 13, 2004

(54) METHOD OF PRODUCING TRENCH INSULATION IN A SUBSTRATE

(76) Inventor: Werner Muth, Lenaustrasse 11, D-81373 München (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/051,283

(22) PCT Filed: Oct. 2, 1996

(86) PCT No.: PCT/EP96/04304
§ 371 (c)(1),
(2), (4) Date: Aug. 24, 1998

(87) PCT Pub. No.: WO97/14182
PCT Pub. Date: Apr. 17, 1997

(65) Prior Publication Data
US 2002/0037626 A1 Mar. 28, 2002

(30) Foreign Application Priority Data
Oct. 12, 1995 (DE) .......................... 195 38 005

(51) Int. Cl.[7] .................................. H01L 21/76
(52) U.S. Cl. ................ 438/404; 438/424; 438/425; 438/426; 438/427; 438/428; 438/429; 438/430; 438/431; 438/432; 438/435; 438/438; 438/439; 438/443; 438/444; 438/445; 438/446
(58) Field of Search ................ 438/402, 386, 438/149, 404, 424–432, 435–439, 455, 697, 443–448; 257/378, 302, 514, 520, 647

(56) References Cited

U.S. PATENT DOCUMENTS

| 4,104,086 A | * | 8/1978 | Bondur et al. ..... 148/DIG. 131 |
| 4,497,665 A | * | 2/1985 | Fukuda ........................ 438/425 |
| 4,507,849 A | * | 4/1985 | Shinozaki ..................... 438/430 |

(List continued on next page.)

FOREIGN PATENT DOCUMENTS

| DE | 44 04 757 A1 | 8/1995 |
| EP | 0 300 569 A1 | 1/1989 |
| EP | 0 656 651 A2 | 6/1995 |
| FR | 2599892 A1 | 12/1987 |
| JP | 61 11 5335 A | 6/1986 |
| WO | WO 93/10559 | 5/1993 |
| WO | WO 93/26041 | 12/1995 |

OTHER PUBLICATIONS

Blumstock, K. et al, "Shallow Trench Isolation for Ultra–Large–Scale Integrated Devices", in J. Vac. Sci. Technol. B12(1), Jan.–Feb. 1994, pp. 54 to 58.

Primary Examiner—Eddie Lee
Assistant Examiner—José R. Diaz
(74) Attorney, Agent, or Firm—Dougherty, Clements & Hofer

(57) ABSTRACT

In a method of producing a trench insulation in a silicon substrate a first silicon-oxide layer is deposited on a front surface of a sequence of layers including the silicon substrate. Then the first silicon-oxide layer is structured so as to define a mask for a subsequent production of a trench. A trench is etched with a predetermined depth in the silicon substrate making use of the mask and filled with a silicon oxide. Then a first polysilicon layer is conformally deposited on the first silicon-oxide layer and on the oxide-filled trench. The first polysilicon layer is removed in such a way that a polysilicon cover remains on the oxide-filled trench, and the first silicon-oxide layer is removed.

9 Claims, 18 Drawing Sheets

U.S. PATENT DOCUMENTS

| | | | |
|---|---|---|---|
| 5,015,602 A | * 5/1991 | Van Der Plas et al. | 438/424 |
| 5,173,439 A | 12/1992 | Dash | |
| 5,362,667 A | 11/1994 | Linn | |
| 5,387,539 A | * 2/1995 | Yang et al. | 438/427 |
| 5,416,041 A | 5/1995 | Scwalke | |
| 5,445,988 A | 8/1995 | Scwalke | |
| 5,494,837 A | * 2/1996 | Subramanian et al. | 438/149 |
| 5,561,073 A | * 10/1996 | Jerome et al. | 438/404 |
| 5,646,053 A | * 7/1997 | Schepis et al. | 438/402 |
| 5,753,560 A | * 5/1998 | Hong et al. | 438/402 |
| 5,759,907 A | * 6/1998 | Assaderaghi et al. | 438/386 |
| 5,877,065 A | * 3/1999 | Yallup | 438/404 |
| 5,972,773 A | * 10/1999 | Liu et al. | 438/424 |
| 6,008,526 A | * 12/1999 | Kim | 257/647 |
| 6,432,799 B1 | * 8/2002 | Hashimoto et al. | 438/435 |

* cited by examiner

METHOD OF PRODUCING TRENCH INSULATION IN A SUBSTRATE

BACKGROUND OF THE INVENTION

1. Filed of the Invention

The present invention refers to a method of producing a trench insulation in a substrate.

2. Description of the Related Art

In the prior art, limits are set to the application of integrated semiconductor circuits, especially CMOS circuits, on a monocrystalline silicon basic material, so-called bulk silicon, wafers with regard to the use at high ambient temperatures. When power components are used, application limits result from the dissipation power of the component, which causes an increase in the crystal temperature during operation. The maximum dielectric strength that can be achieved is then limited by the blocking property of the pn junctions and by the so-called latch-up effect.

The cause of these limitations is essentially to be found in the fact that, in conventional circuits, the components defining the circuit are electrically insulated from one another by blocked pn doped junctions. This has the effect that, on the one hand, a voltage limit is given by the breakdown voltage of these pn junctions and, on the other hand, the circuit design is subjected to restrictions insofar as pn junctions block only in one voltage direction, but conduct the current in the inverted voltage direction. The limitation of the maximum admissible crystal temperature of these components is additionally given by the surrounding volume of the crystal material which is large in comparison with the volume of the actual component, e.g. the transistor. From a temperature of 130° C. onwards, the undesired transistor leakage current caused by the crystal temperature is no longer predominantly due to the generation of electron hole pairs in the space-charge zones of the blocked pn junctions themselves, but it is predominantly due to those electron hole pairs which are generated in the vicinity of the pn junction, diffuse to said pn junction and contribute to the reverse current.

In the prior art, it is known that these limitations can be partly or fully eliminated by introducing a dielectric insulation instead of the insulation by means of pn junctions; in the case of such a dielectric insulation, each of the individual components defining the integrated circuit is fully surrounded by an insulator.

This kind of insulation is known in the prior art, but its production normally entails great expenditure.

For this purpose, so-called Silicon On Insulator silicon wafers (SOI silicon wafers; SOI=Silicon On Insulator) are commercially available; when these silicon wafers are used for producing integrated circuits, a dielectric insulation from the basic material is given. In this case, the basic material only serves as a mechanical support.

The lateral dielectric insulation can be achieved e.g. by the so-called mesa technique, but with the drawback of great topographic height differences after the mesa etching. This topology is not tolerable within modern VLSI and ULSI processes (VLSI=Very Large Scale Integration; ULSI=Ultra Large Scale Integration) and, without additional levelling measures, it is therefore incompatible.

For solving the problem of lateral dielectric insulation, the so-called trench insulation technique has therefore become generally accepted in the prior art. This technique comprises the step of etching a trench into the monocrystalline usable semiconductor layer at the smallest possible distance permitted by the technical-physical boundary conditions, said trench extending from the wafer surface to the boundary of the monocrystalline usable semiconductor layer. The trench surrounds the individual components or groups of individual components in the form of a closed boundary. For eliminating the differences in height resulting from trench etching and for achieving a permanent insulating property, it is necessary to fill the trench with an electrically insulating material, or to coat the trench walls with an electrically insulating material and to fill the residual trench with semi-insulating, semiconductor or conductive material.

The materials that can be used for this purpose are only those which are compatible with the subsequent semiconductor-technological production steps. The methods used are e.g. complete filling of the trench by thermal oxidation, partial filling of the trench by thermally oxidizing the trench walls and additional filling of the rest of the trench e.g. by means of a silicon dioxide, doped silicon dioxide, polysilicon or amorphous silicon, which are all deposited by means of a conformingly depositing CVD process (CVD= Chemical Vapour Deposition=chemical deposition from the vapour phase). If the material deposited is insulating, also said material alone can be used for filling the trench. Normally, an anisotropic back-etching step will be necessary after the CVD process.

The above-described methods of producing a trench insulation show a plurality of disadvantages. These disadvantages are that process control is complicated, that individual process steps must be used, which demand a great deal from the equipment used and from the settings of the devices used, that the demands with regard to process tolerances are high, that indiviudal process steps are used, which are not compatible with the demands to be met in the case of a CMOS production process, that a plurality of additional lithographic steps is required, that high demands are to be met with regard to the adjusting accuracy of successive masking steps, that, in addition to the standard CMOS process steps to be carried out, the further steps required for producing the trench must be carried out with a high additional expenditure, and that a large amount of lateral space is required for the insulation.

EP 0 656 651 A2 refers to a method of producing an integrated circuit arrangement, comprising the step of producing, in a two-step trench process, a trench structure in a substrate wafer. In a first etching step, a trench mask is produced, and, in a second etching step, the trench structure in the substrate wafer is produced. Subsequently, the trench structure is filled by whole-area deposition of an amorphous silicon layer, whereby silicon spacers are formed. Following this, $SiO_2$ spacers are formed by oxidation of the silicon spacers and the remaining space between the spacers is filled with a silicon filling which is produced by oxidation so as to close the trench structure by a cover. Filling of the trench is not effected by a local oxidation technique. WO 93/10559 refers to a method of producing deep trenches in semiconductor substrates, which are filled with insulation material. A trench is etched in an appropriately prepared substrate, the walls of the trench being then lined with a dielectric material in a subsequent step. Following this, a thick polysilicon layer is deposited onto the whole substrate, whereby also the trench is filled with the polysilicon. It follows that the trench is not filled by a local oxidation technique.

SUMMARY OF THE INVENTION

Starting from this prior art, it is the object of the present invention to provide a method of producing a trench insulation in a silicon wafer, which guarantees simple process control and which carries out a plurality of necessary sub-process steps, without any additional expenditure, together with the standard CMOS process steps that have to be carried out anyway.

The present invention provides a method of producing a trench insulation in a silicon wafer. The method has the steps of depositing a first silicon-oxide layer on a ore manufactured sequence of layers on the front surface of a silicon wafer, structuring the first silicon-oxide layer so as to define a mask for a subsequent production of a trench, etching a trench having a predetermined depth in the silicon wafer making use of said mask, filling the trench with a silicon oxide, conforming deposition of a first polysilicon layer on the first silicon-oxide layer and on the oxide-filled trench, removing the first polysilicon layer in such a way that a polysilicon cover remains on said oxide-filled trench and removing the first silicon-oxide layer.

In comparison with the prior art described hereinbefore, the present invention provides a plurality of advantages, viz.

that process control is simple;

that individual process steps are used, which demand as little as possible from the equipment, said process steps permitting thus the production of a trench insulation in a manner which is as simple as possible and simultaneously reliable, that individual process steps are used, which demand as little as possible from the setting of the machines, that the demands to be met by the process tolerances are as low as possible (large process windows), that indiviudal process steps are used, which are compatible with the demands to be met in the case of a CMOS production process, that only a single additional lithographic step is required, that no unusually high demands are to be met by the adjusting accuracy of successive masking steps and that constrained mask derivatives are not necessary, that the temporal succession of the additional steps which are specific to trench production is chosen such that subtasks are automatically carried out, without any additional expenditure, together with standard CMOS process steps which are to be carried out anyhow, that little lateral space is required for the insulation, that future advantages in comparison with known methods can be seen, when in the course of the foreseeable technical development the lithographic dimensions used in production will be reduced still further.

BRIEF DESCRIPTION OF THE DRAWINGS

In the following, a preferred embodiment of the present invention will be described in detail on the basis of the drawings enclosed, in which.

DETAILED DESCRIPTION OF THE PREFERRED EMBODIMENTS

Figure 1:
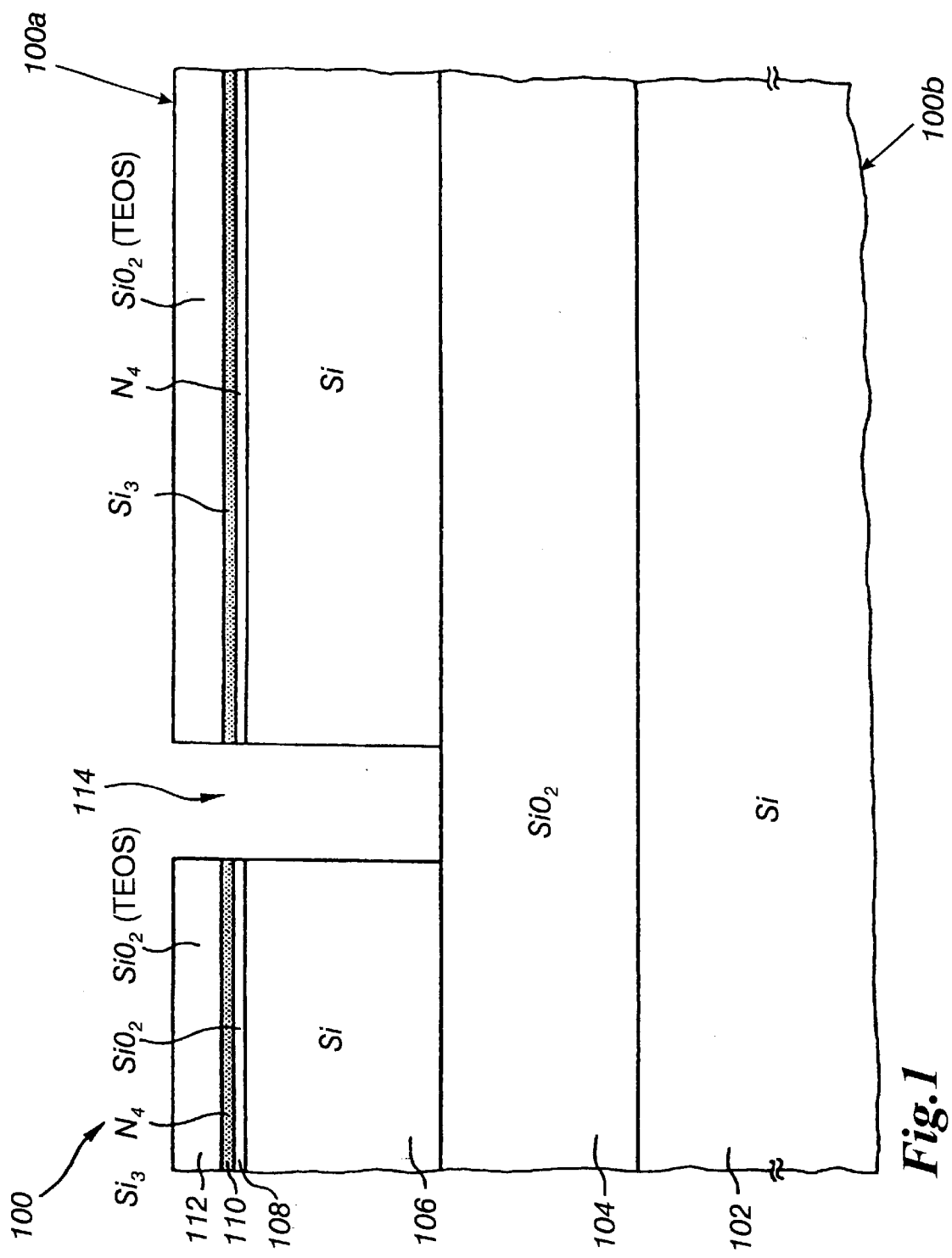
FIG. 1 shows a semiconductor substrate having the trench formed in its first main surface.

It is pointed out that identical reference numerals have been used in all figures for corresponding layers, components etc.

The first embodiment of the method according to the present invention described hereinbelow deals with a trench insulation technique in the case of which the layer thickness remaining in the SOI wafer is laterally separated by means of a trench around the component. The trench is etched from the surface down to the insulator layer located below the active crystal layer and it is filled with insulating material so that, at the end, a largely planar surface of the overall arrangement or total circuit is obtained.

The starting wafer used for the embodiment described hereinbelow is a special kind of SOI wafer, viz. a so-called BESOI wafer (BESOI=Back Etched Silicon On Insulator), which is offered by an increasing number of manufacturers all over the world. The BESOI wafer 100 (see FIG. 1) has a front surface 100*a* which is commonly polished and therefore prepared for manufacturing semiconductor devices (further called front), and a back surface 100*b* which is commonly dull and used for mechanically supporting the wafer during manufacturing and handling (further called back). The trench is formed in the front.

In the technical development taking place in this field there is a growing trend towards an availability of a wafer with increasingly small layer-thickness tolerances and, consequently, thin usable layers which become smaller and smaller and which can be produced in large-scale manufacturing processes.

The advantage in comparison with an alternative production method for an SOI wafer is the good crystal quality of the usable layer, the quality and the variation possibilities of the silicon dioxide layer located below said usable layer and the comparatively low price.

For the embodiment described hereinbelow, a BESOI wafer is used, which has a usable layer thickness of approx.

2±0.5 μm and a thickness of 2 μm of the silicon dioxide layer (SiO$_2$ layer) located below said usable layer on the front.

This material was commercially available at the time of the present invention.

Wafer with thinner usable layer thickness with correspondingly smaller thickness tolerances, which will be available in the future, will be advantageous for the sequence of process steps in low-power applications described hereinbelow, with regard to improved component properties and less complicated process control.

The BESOI material used in accordance with this preferred embodiment has in a usable layer (bond) a specific resistance of 17 to 33 Ω cm, which is adjusted to this value with regard to the properties which the transistor produced is desired to have at the end of the process.

In a first process stage I, the production of a non-structured layer sequence is prepared.

In a first method step S1, a prenitride oxide layer or pad oxide layer having a thickness of 40 nm grows on the front of the BESOI wafer, which is referred to as sequence of layers in the following, at a temperature of 950° C. in a dry, oxygenous atmosphere.

In a second method step S2, a nitride layer having a thickness of 100 nm is deposited on the front and on the back of the sequence of layers by means of an LPCVD process (LPCVD=Low Pressure Chemical Vapour Deposition=low pressure deposition from the gaseous phase).

In a third method step S3, an oxide layer is deposited on the nitride layer, which has been applied to the front and to the back of the sequence of layers, by means of an TEOS-LPCVD process (TEOS=tetraethylorthosilicate). The oxide layer is deposited with a thickness of 200 nm and is also referred to as deposited oxide layer which serves to protect the surface of the nitride layer applied in method step S2.

In a fourth method step S4, the nitride layer is removed from the back of the sequence of layers. The deposited oxide serves here as a protection against contamination when, during etching of the back of the sequence of layers, the front of the sequence of layers rests on the support or chuck of the etching system.

Wet etching of the back of the sequence of layers by means of a conventional basin immersion process cannot be carried out directly, since production-compatible organic cover layers are not resistant to the hot phosphoric acid.

The demands on the selectivity of this etching process are very low. It is only necessary that the deposited oxide layer (step S3) and the nitride layer (step S2) are etched fully through.

Excessive etching into the carrier silicon which is comprised in the sequence of layers and which has a thickness of at least 0.5 mm is undetrimental when it occurs as a result of the non-uniformity caused by very simple machines.

In a fifth method step S5, the sequence of layers is cleaned.

In a sixth method step S6, the deposited oxide layer on the front of the sequence of layers is removed by immersion of the sequence of layers into an etching solution containing hydrofluoric acid. The etching solution containing hydrofluoric acid is used due to the high selectivity of the hydrofluoric acid (HF) with regard to the nitride layer. Subsequently, the sequence of layers is rinsed with deionized water, dried and tempered at 750° so as to remove adsorbed water molecules.

In a seventh method step S7, a first oxide layer is deposited with a thickness of 470 nm on the nitride layer, which has been deposited in step S2, by means of an TEOS LPCVD process. This oxide layer serves as a so-called hard mask for a subsequent trench etching.

The aim of the process stage I described hereinbefore was the production of a laterally initially still unstructured layer 100, as shown in the right half of FIG. 1. The sequence of layers 100 comprises a monocrystalline silicon carrier wafer 102;

a buried silicon dioxide layer 104 (SiO$_2$ layer);

a thinned monocrystalline usable component layer 106;

a standard pad oxide layer 108 for stress equalization during the subsequent local oxidation;

a silicon nitride layer 110 (Si$_3$N$_4$ layer) for forming a nitride mask during a subsequent local oxidation;

a deposited silicon dioxide layer (SiO$_2$ layer) 112 which serves as a mask or hard mask during a subsequent trench etching process.

On the back of the layer structure 100 there is now only the deposited silicon dioxide layer (SiO$_2$ layer)—which is not shown.

In a subsequent process stage II, the silicon dioxide layer 112 is structured as a trench mask and the trench is etched.

In an eighth method step S8, a photoresist is applied to the first oxide layer 112. It is pointed out that the narrower the trench can be etched, the shorter and the more advantageous the subsequent process sequence will be. The technical progress of future process generations will have a positive influence on the final result that can be achieved.

In a ninth method step S9, the mask or hard mask is etched. For this purpose, the photoresist layer applied in method step S8 is structured in an appropriate manner and, at the points at which the trench is to be produced, the exposed deposited oxide layer 112 is etched by means of an anisotropic oxide plasma etching process down to the monocrystalline usable silicon layer 106.

It is pointed out that this plasma etching process for silicon dioxide is a standard technique, which is frequently used e.g. for opening contact holes when silicon circuits are being produced.

The small selectivity with regard to nitride, which is a characteristic of dry oxide etching processes, has the effect that the nitride layer 110 is structured as well. This is here a desired effect. Excessive etching into the usable silicon layer 106 is at this point undetrimental to the desired final result.

In a tenth method step S10, the still remaining photoresist layer is removed by means of an oxygen plasma treatment after the structuring of the mask or hard mask. In addition, it may also be necessary to remove residual polymers with a wet-chemical stripper.

In an eleventh method step S11, the actual trench 114 is etched into the monocrystalline usable layer 106 by means of an anisotropic chloroplasma dry etching process.

Reference is made to the fact that the above-described anisotropic chloroplasma dry etching process is used e.g. for structuring polysilicon gate electrodes or in an etching process of the type used for producing trench cells in the case of dynamic RAMs (RAM=Random Access Memory).

The structured oxide layer 112 on the surface of the sequence of layers 100 serves here as a masking layer.

The buried thermal silicon dioxide layer 104 serves here as an etch stop in the depth of the trench.

The selectivity of a chloroplasma etching process is approx. 10:1 to 20:1, i.e. the etching rate in silicon is ten times higher than that in SiO$_2$. This guarantees a large process window, which permits tolerances with regard to the etching time, the etching rate and the lateral uniformity over the sequence of layers 100.

The structure obtained after process stage II is shown in FIG. 1.

A process stage III only comprises the twelfth method step S12 in which the trench 114 is filled by oxidation.

An essential feature of the present invention is to be seen in the fact that, while the trench 114 is being filled by oxidation, the structured deposited oxide layer 112 "hard mask" remains unchanged on the sequence of layers 100.

The sequence of layers is now subjected to oxidation in a thermal oxidation process in a water-vapour atmosphere until the trench 114 has filled up. It is a characteristic feature of this thermal oxidation that the resultant layer thicknesses are produced in approximately equal parts by consumption of the oxidized silicon and by the oxygen supplied from outside. The oxidation time must therefore be adjusted at least such that an oxide layer thickness corresponding in size to the single width of the trench grows on a simultaneously oxidized bare silicon wafer. When the trench width is 1 $\mu$m, this being a width that can reliably be achieved by today's lithographic processes, an oxide layer of 1 $\mu$m thickness must grow. When the trench width is 0.8 $\mu$m, this being a width that can be achieved by modern exposure processes, it will, analogously, suffice when an oxide layer of 0.8 $\mu$m thickness grows. This makes evident that the present trend towards smaller dimensions in semiconductor technology provides a technical advantage in the case of this method in contrast to filling methods by means of conforming deposition from the vapour phase, which would correspond to the prior art.

In the case of non-ideal, i.e. not fully reaction-limited, conforming depositions processes, it may easily happen that the part of the trench located closer to the surface is filled more rapidly than the part located further down. This has the consequence that the trench will already be closed on the upper side, whereas a capillary cavity, a so-called pipe cavity, remains in the lower part.

The oxidation-filling process used for the embodiment described in the present connection is almost ideally reaction-limited in the case of the existing geometries and will certainly not result in pipe cavities when the trench does not have any negative flank angles.

During the progressive thermal oxidation of silicon, the oxygen must diffuse through the $SiO_2$ layer, which has already grown, to the silicon-$SiO_2$ boundary surface. The chemical reaction will not take place until this boundary surface has been reached. Diffusion barriers, like the remaining deposited oxide layer 112 of the hard mask and most of the $Si_3N_4$ layer according to the embodiment described in the present connection, make it possible that the local oxidation used here results in conforming uniform filling of the trenches alone.

The oxidation-filling process of the trench walls is self-limiting, since the replenishing of oxygen from the oxidation atmosphere is automatically reduced by orders of magnitude as soon as the layer fronts from both sides of the trench contact each other in the middle.

Figure 2:
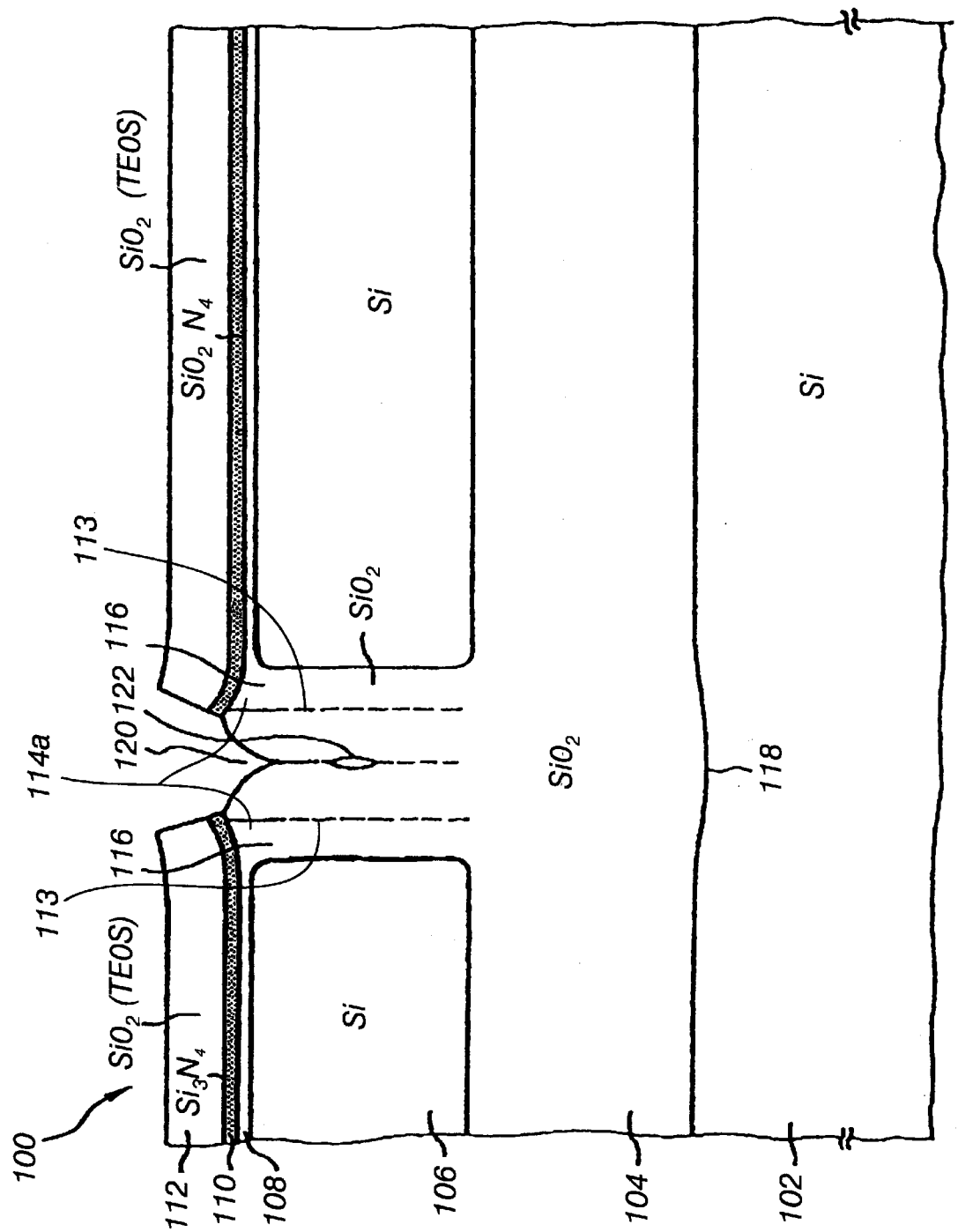
FIG. 2 shows the semiconductor substrate after the trench filling process.

The condition of the sequence of layers 100 resulting from the trench filling process is shown in FIG. 2. The $SiO_2$ layer 116 on the trench walls has grown under half the originally existing mask delimiting the trench. The broken line 113 in FIG. 2 shows the dimensions of the original trench 114.

On the upper side of the new lateral boundary of the trench, the so-called "birdsbeak", 114a which has been known for a long time from local oxidation technology (LOCOS), has formed below the $Si_3N_4$ layer 110 and bent the mask upwards, i.e. away from the front of the sequence of layers, at the edge thereof.

On the boundary surface of the silicon carrier layer 102 located opposite the trench some oxide has additionally grown; this results in the bulge 118 of the buried oxide layer 104 shown in FIG. 2.

The two phenomena described last and the edge rounding at the lower side of the trench originate from the oxygen diffusion mechanisms described hereinbefore.

In the middle of the now filled trench, two problem areas can be seen; in view of these problem areas this initially simple method could not be used easily.

The first problem area is the so-called "gusset" 120 on the upper side of the sequence of layers 100. During the subsequent process steps, remnants of chemicals and particles may collect in this gusset; during a polysilicon gate process, remains of polysilicon may unintentionally form conducting paths which may cause short circuits and, consequently, failures of the circuit in question. The second problem area is the possibly still existing "seam" 122 at which the two oxide layers 116 have grown together. Due to capillary effects, etching acid solutions containing hydrofluoric acid may penetrate into this seam, the use of these etching acid solutions being unavoidable in the field of CMOS technology. Once this etching solution has penetrated, it is almost impossible to remove and, due to undesired etching corrosion, it will cause permanent damage during the future manufacturing process and, later on, in the finished circuits.

A feasible method of removing the hard mask again is not known. In spite of their high selectivity with regard to $Si_3N_4$, etching solutions containing hydrofluoric acid cannot be used, since they would preferably attack in the area of the gusset 120 and thus partly defill the trench.

Anisotropic oxide etching processes are too unselective with regard to $Si_3N_4$ and would not alter the disadvantageous profile of the gusset.

Reference is made to the fact that different oxidation methods or combinations of known oxidation methods can be used for filling the trench with an oxide. A first possible method is the filling the trench with an CVD oxide. Another possibility is filling by means of thermal oxidation. In accordance with still another possibility, the trench can be filled partly by means of thermal oxidation and the rest of the trench can be filled with a CVD oxide, or vice versa.

In a subsequent process stage IV, the disadvantages described hereinbefore are eliminated.

In order to avoid the problems arising from the filling of the trench, a layer 124 of undoped polysilicon is deposited, immediately afterwards without any further intermediate step, from the gaseous phase in a conformingly working LPCVD process in a thirteenth method step S13.

A polysilicon deposition process is a constituent part of any modern polysilicon gate total process and is therefore known in the production field in question.

The use is here unproblematic, since edges having overhanging flanks (negative flank angle) do not exist in the present case. For the etched trench width of 1 $\mu$m, a deposited layer thickness of 0.7 to 0.8 $\mu$m proves to be expedient. The production state which has now been reached can be seen in FIG. 3 and FIG. 4, respectively.

It is pointed out that this step of conforming deposition of the polysilicon is an important feature of the method according to the present invention.

By means of the conforming deposition process, it was first of all possible to round off the pointed, disadvantageous topography in the area of the gusset 120 and, simultaneously, it was possible to reduce the differences in height on the front of the sequence of layers 100.

Figure 3:
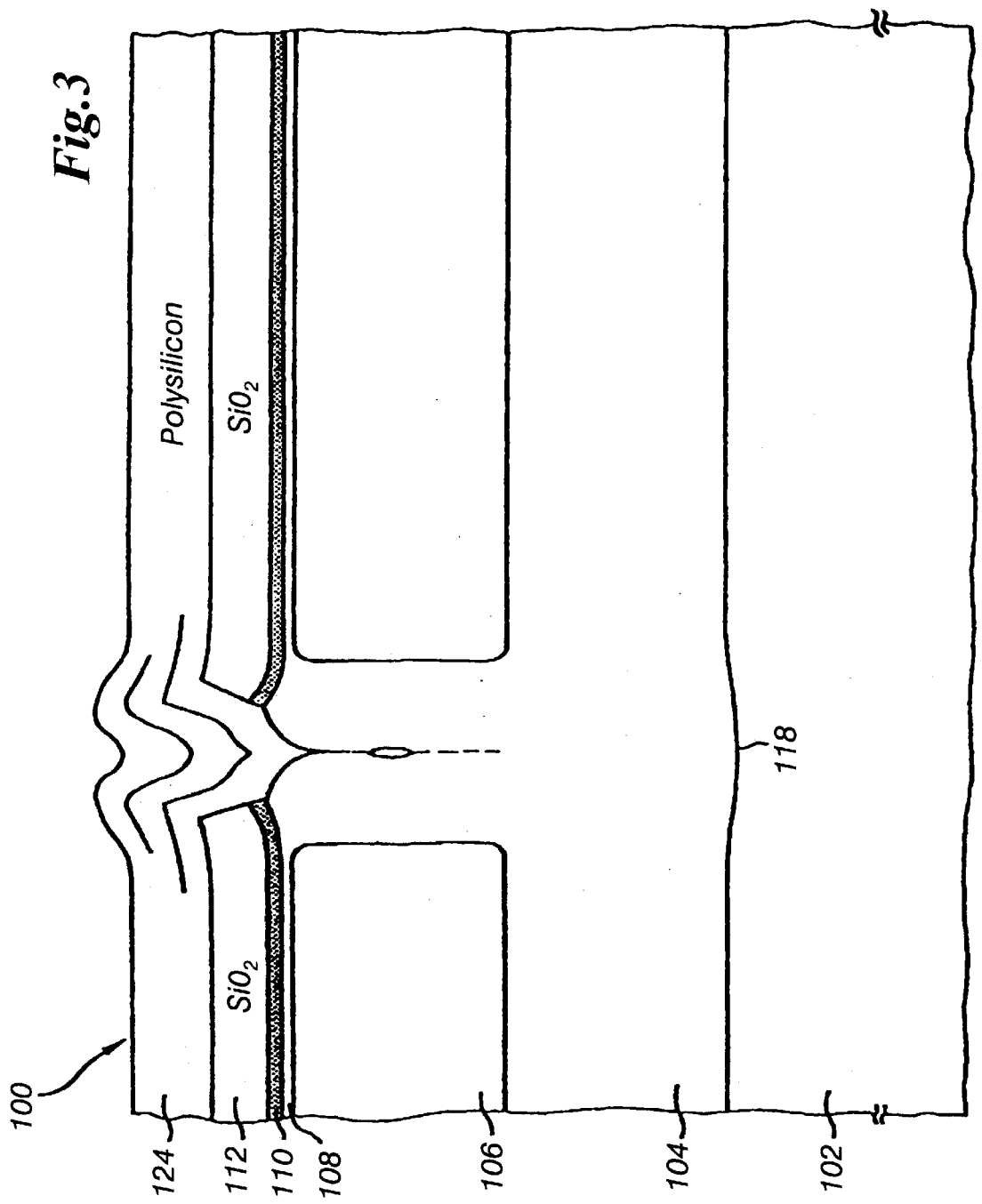
FIGS. 3 and 4 show the semiconductor substrate after a polysilicon deposition process of the substrate of FIG. 2.
Figure 4:
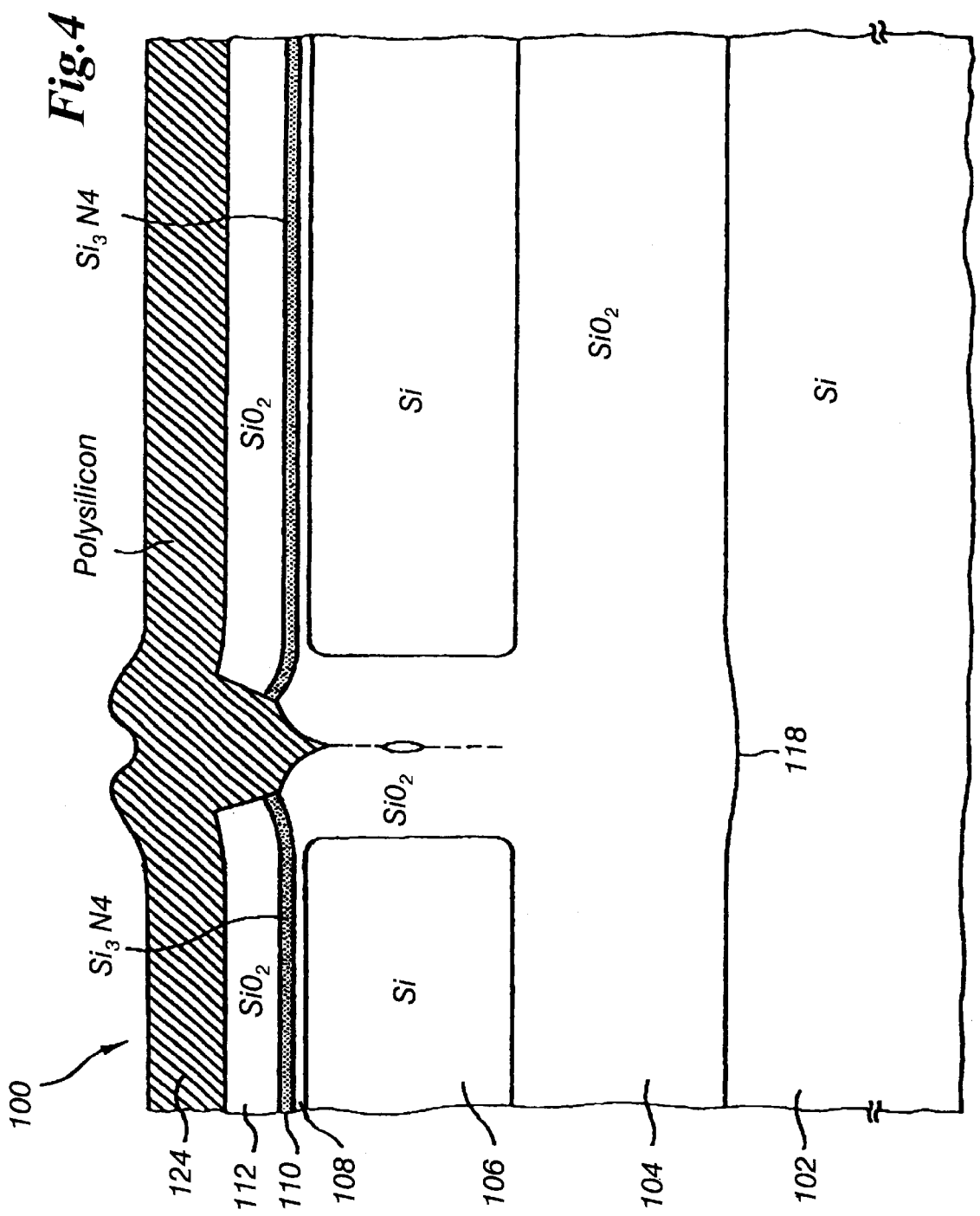

Although this is not shown in FIGS. 3 and 4, a polysilicon layer was also deposited on the back of the sequence of layers 100 by means of the polysilicon deposition process.

In a fourteenth method step S14, the polysilicon layer is removed from the back of the sequence of layers 100 over the whole area. This is done by means of a plasma etching process. During this etching process, the front surface of the sequence of layers 100 of the wafers is positioned on the chuck of the etching system.

The deposited oxide, which was also applied to the back of the sequence of layers 100 in method step S7, serves as an etch stop layer.

In a fifteenth method step S15, the deposited polysilicon layer 124 is etched away by means of an anisotropic chloroplasma etching process without any further intermediate step and without making use of a mask. This can be done in the same system which is used for structuring gate electrodes, or it can be the same system which was used for etching the trench.

The selectivity of this silicon etching process is in the range of 1:10 to 1:20 with regard to the deposited oxide layer 112 remaining on the front surface of the sequence of layers 100.

It follows that a reliable etch stop and immunity to a nonuniformity which is normally entailed by this type of production process are given.

The $Si_3N_4$ layer is 110 therefore preserved undamaged.

The anisotropic etching process uniformly removes the layer to be etched 124 predominantly in a direction perpendicular to the wafer surface.

Figure 5:
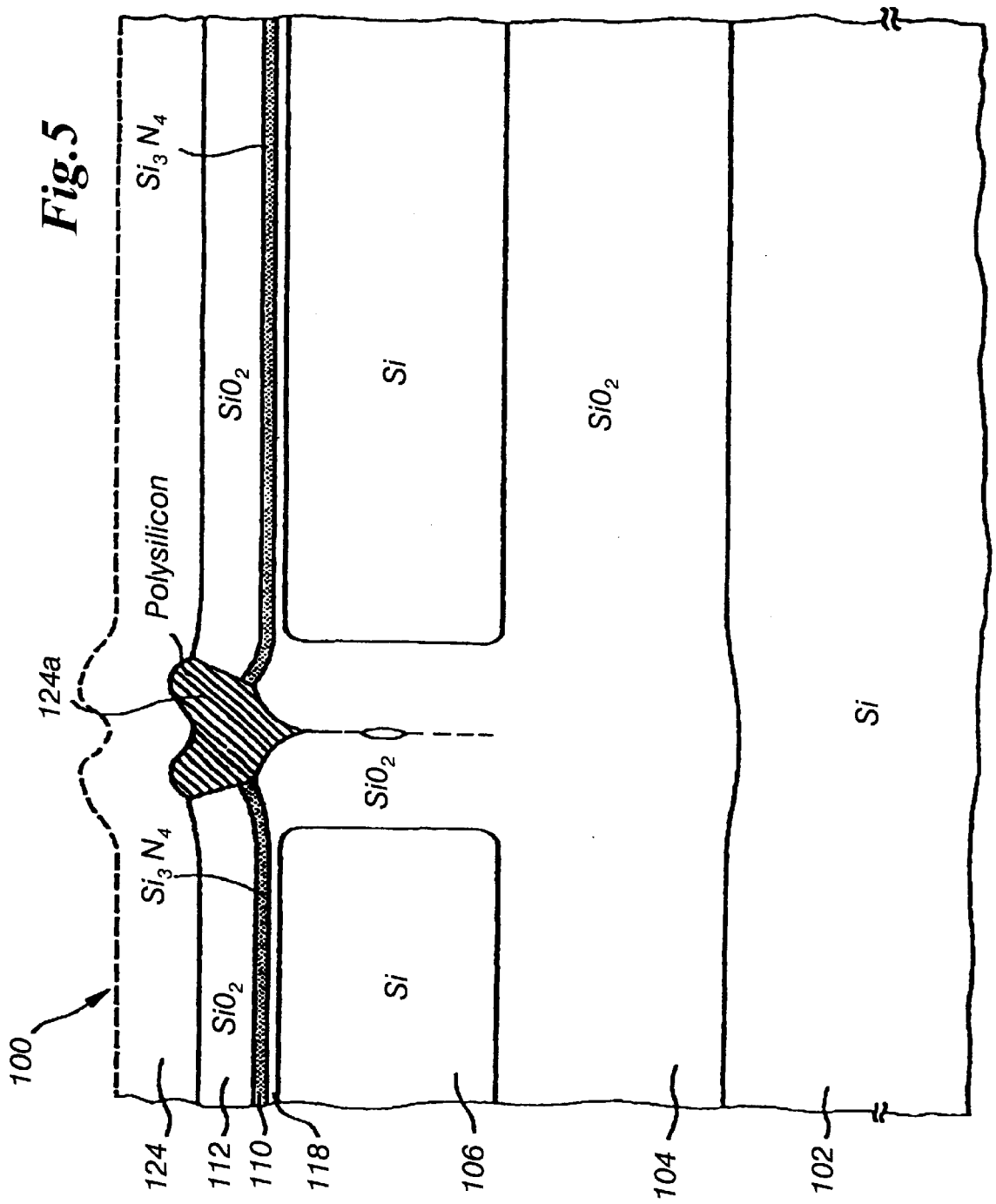
FIGS. 5 and 6 show the semiconductor substrate after plasma etching of the polysilicon layer.

FIG. 5 shows the resultant levelling effect of the back-etching of the polysilicon layer 124. The original surface is here represented by a broken line.

Figure 6:
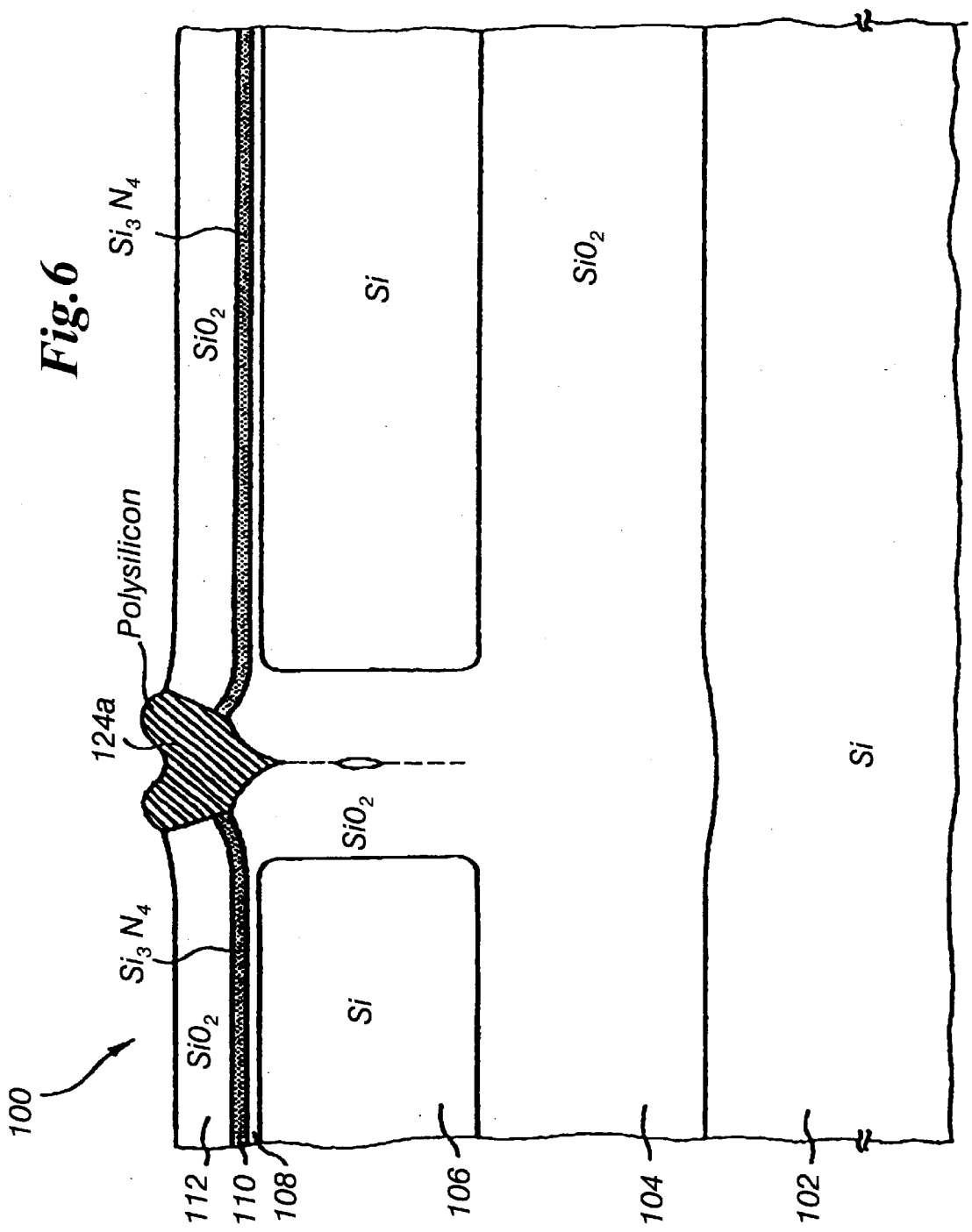

FIG. 6 shows the condition of the sequence of layers 100 when method step S15 has been finished.

As can be seen from FIG. 6, the application of the above-described anisotropic back-etching step S15 has the effect that the trench gusset 120 is levelled and that a polysilicon cover 124a is formed on the oxide-filled trench 114.

Reference is made to the fact that the formation of the polysilicon cover 124a on the oxide-filled trench 114 is an essential feature of the present invention.

In a method step S16, the remaining mask is now removed by simple wet-chemical basin immersion etching in a solution containing hydrofluoric acid.

The back of the sequence of layers 100, which must be rendered hydrophobic, serves as a monitor for the end of the etching process.

Etching solutions containing hydrofluoric acid have a selectivity of at least 1:100 with regard to silicon as well as with regard to $Si_3N_4$.

It follows that the hard mask, which consists of the deposited oxide layer 112, can be removed without any difficulties.

Figure 7:
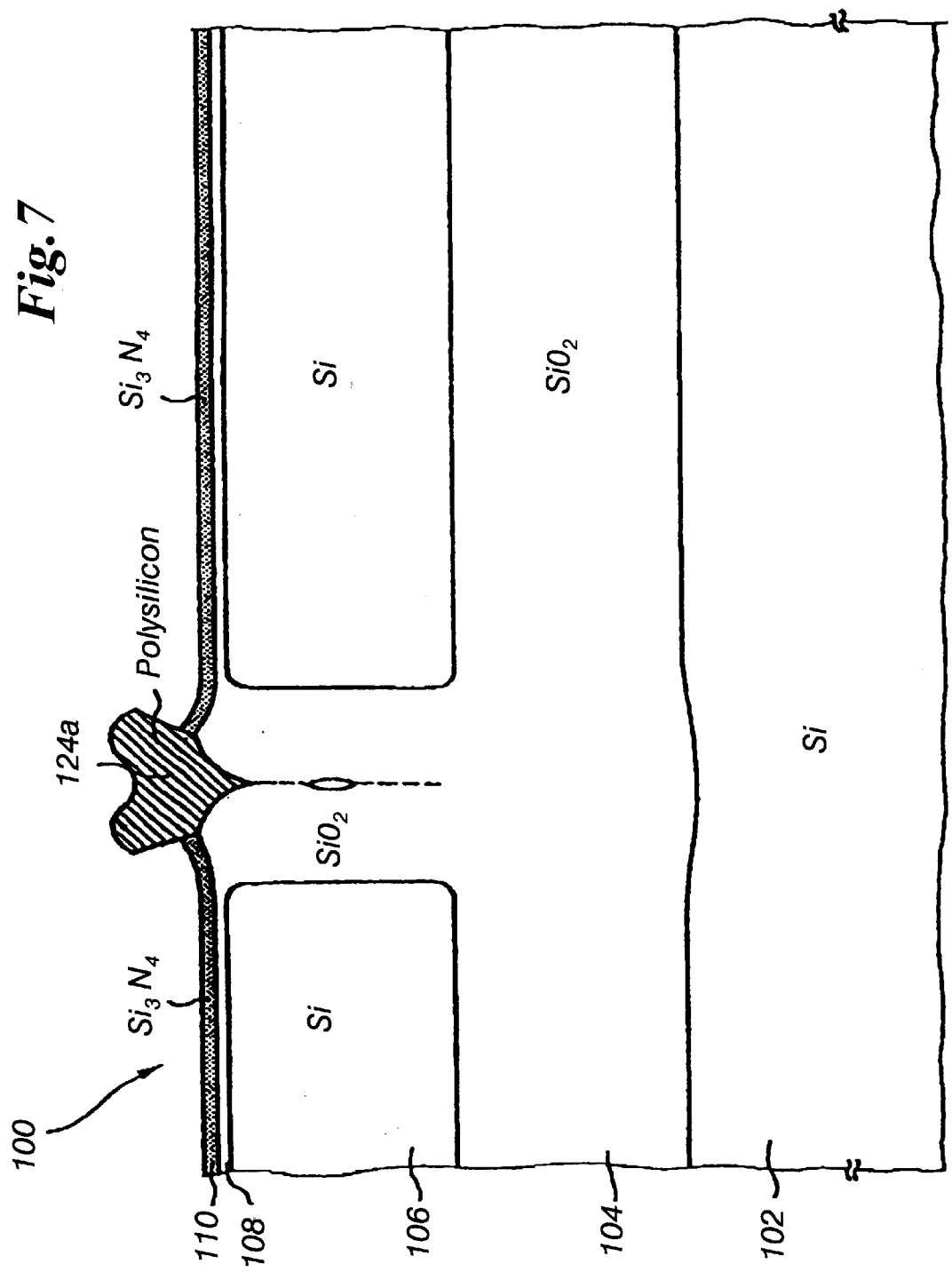
FIG. 7 shows the semiconductor substrate of FIG. 6 after the removal of the oxide layer.

The condition of the sequence of layers 100 after the removal of the deposited oxide layer is shown in FIG. 7.

The method of producing a trench insulation according to the present invention has been described on the basis of process stages I to IV described hereinbefore.

By means of this method, a trench filled with insulating material has been produced on the one hand, and, on the other hand, said trench has simultaneously been covered completely and partially levelled making use of a material that is largely resistant to the wet-chemical etching solutions which contain hydrofluoric acid and which are unavoidable in a CMOS process. In comparison with conventional methods, the following advantages are therefore achieved:

the mask required for etching the trench can easily be removed, the trench is filled with silicon dioxide, but is still covered in this production state in such a way that CMOS-compatible and necessary wet-chemical etching and cleaning steps can be used in the way in which they are normally used in this kind of production process, without jeopardizing the integrity of the trench filling, and the $Si_3N_4$ layer has been preserved so that after the production state shown in FIG. 7 the final integrated circuit can be produced by means of a conventional sequence of CMOS process steps.

Reference is made to the fact that, in the most negative case, the remaining polysilicon cover 124a covering the trench projects relatively far beyond the front surface of the sequence of layers. This is, however, only a momentary intermediate state, since the following, conventional sequence of CMOS process steps comprises a plurality of oxidation steps and selective oxide etching steps which result in a largely planar surface of the sequence of layers 100 at the end of the process.

Subsequently, the final integrated circuit is completed in a process stage V.

In a seventeenth method step S17, which concerns a phototechnique for structuring the $Si_3N_4$ layer 110 so as to produce thick oxide areas by means of local oxidation, conventional dry etching of the $Si_3N_4$ layer is carried out.

Figure 8:
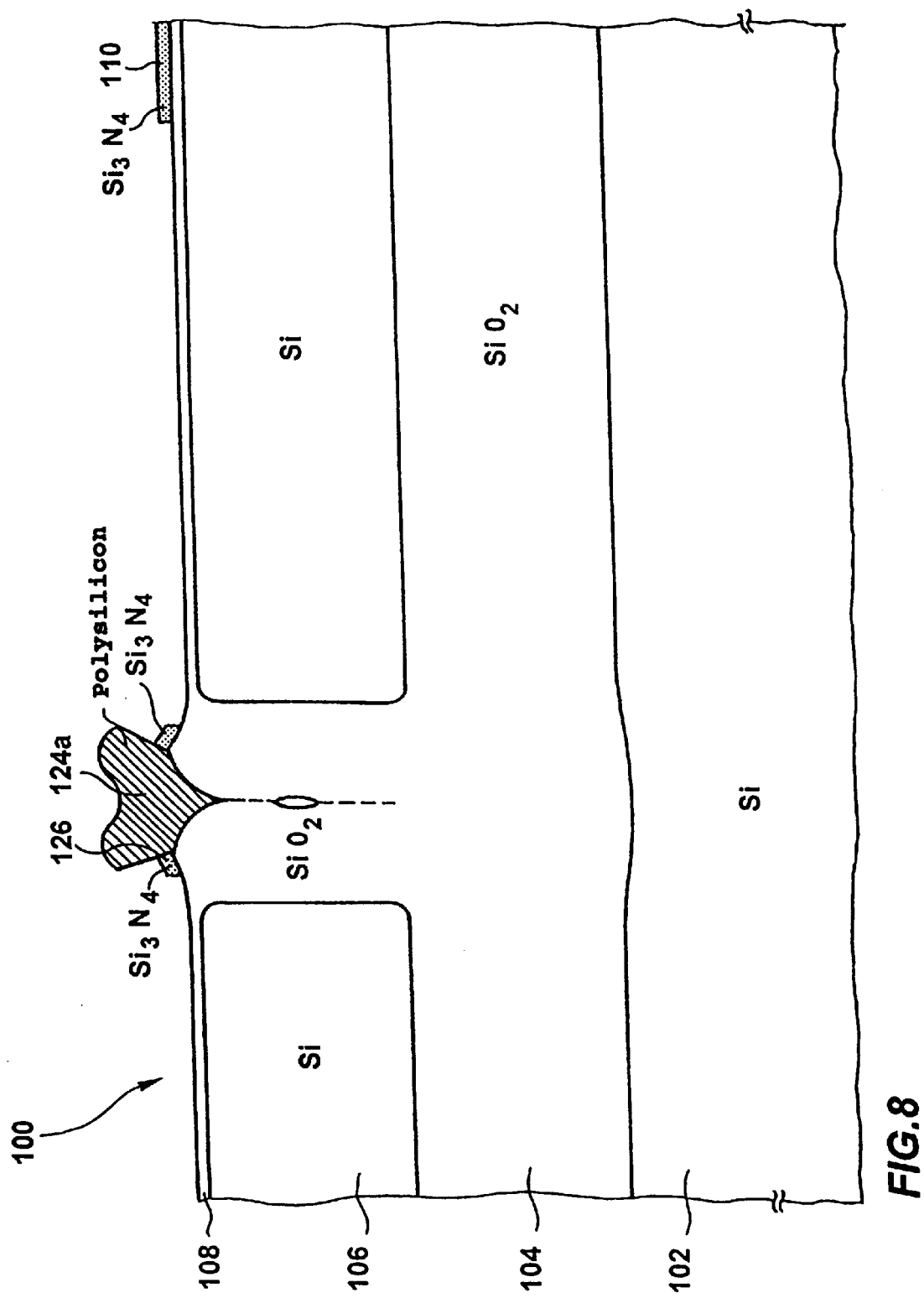
FIG. 8 shows the semiconductor layer of FIG. 7 after structuring the silicon nitride layer.

The production state is shown in FIG. 8.

For taking into account also the worst case, it has been assumed for the continued process that, due to the "shade effect" of the polysilicon cover 124a of the trench 114, an $Si_3N_4$ edge 126 remains as a result of the anisotropic nitride etching process.

Prior to an eighteenth method step, some doping material predeposition steps by means of ion implantation and resist masks are carried out in the CMOS production process, said predeposition steps being known per se among those skilled in the art.

In the case of a widely used process family, it is common practice that the local oxidation for producing the thick oxide areas is preceded by a similar LOCOS subprocess module by means of which the definition of the global n- and p-doped regions can be carried out in a self-adjusting manner (the so-called twin-tub process).

This complicated process module can be dispensed with when the trench insulation according to the present invention is used. In the embodiment described in the present connection, the trench was etched with a width of 1 $\mu$m, the width of the trench in the filled condition being 2 $\mu$m. When the global n- and p-doped regions are defined by means of resist implantation masks and when the resist edge is placed onto the middle of the respective trench when the mask is being designed, the sum of the edge error and of the adjustment error may be ±1 $\mu$m.

This value can easily be achieved by means of the stepper lithography technique which is widely used today.

The higher expenditure entailed by the trench insulation technique is therefore partly compensated for by the above-described possibility of simplifying the process.

In an eighteenth step S18, a field oxidation is carried out e.g. in a humid oxygen atmosphere at 1000° C. The aimed-at oxide thickness is here e.g. 650 nm.

Figure 9:
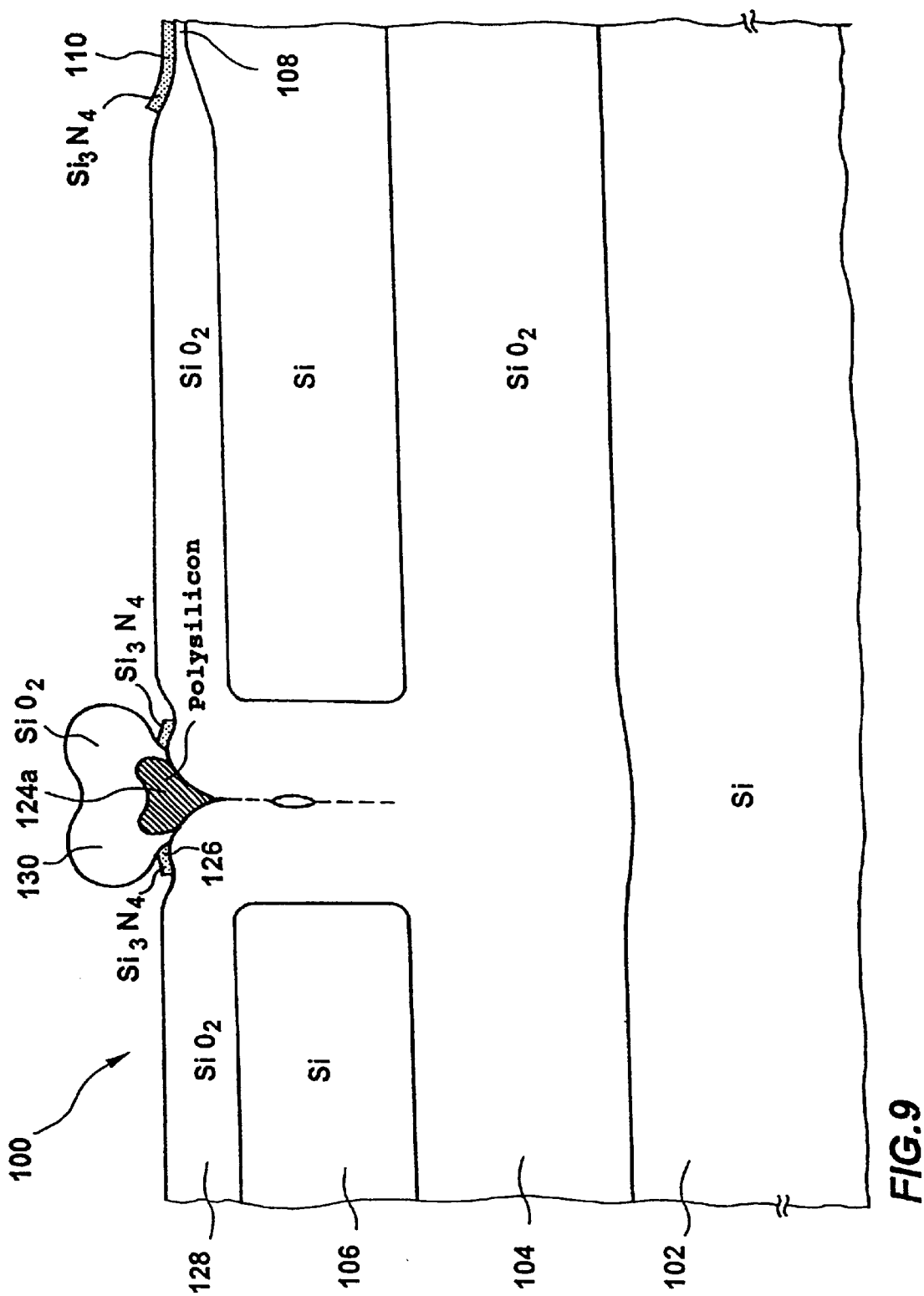
FIG. 9 shows the semiconductor substrate of FIG. 8 after a field oxidation.

As can be seen from FIG. 9, also the trench cover 124a projecting beyond the front of the sequence of layers 100 has been oxidized (cf. layer 130) in addition to the oxidation of the monocrystalline silicon 106 ($SiO_2$ layer 128).

Approx. 350 nm of the trench cover 124a has been consumed for forming the oxide 130 at the trench-cover surfaces exposed to the atmosphere.

In a subsequent nineteenth method step S19, the nitride oxidation mask 110 is fully removed. This is normally done by means of a wet-chemical immersion etching process in hot phosphoric acid at 160° C.

Figure 10:
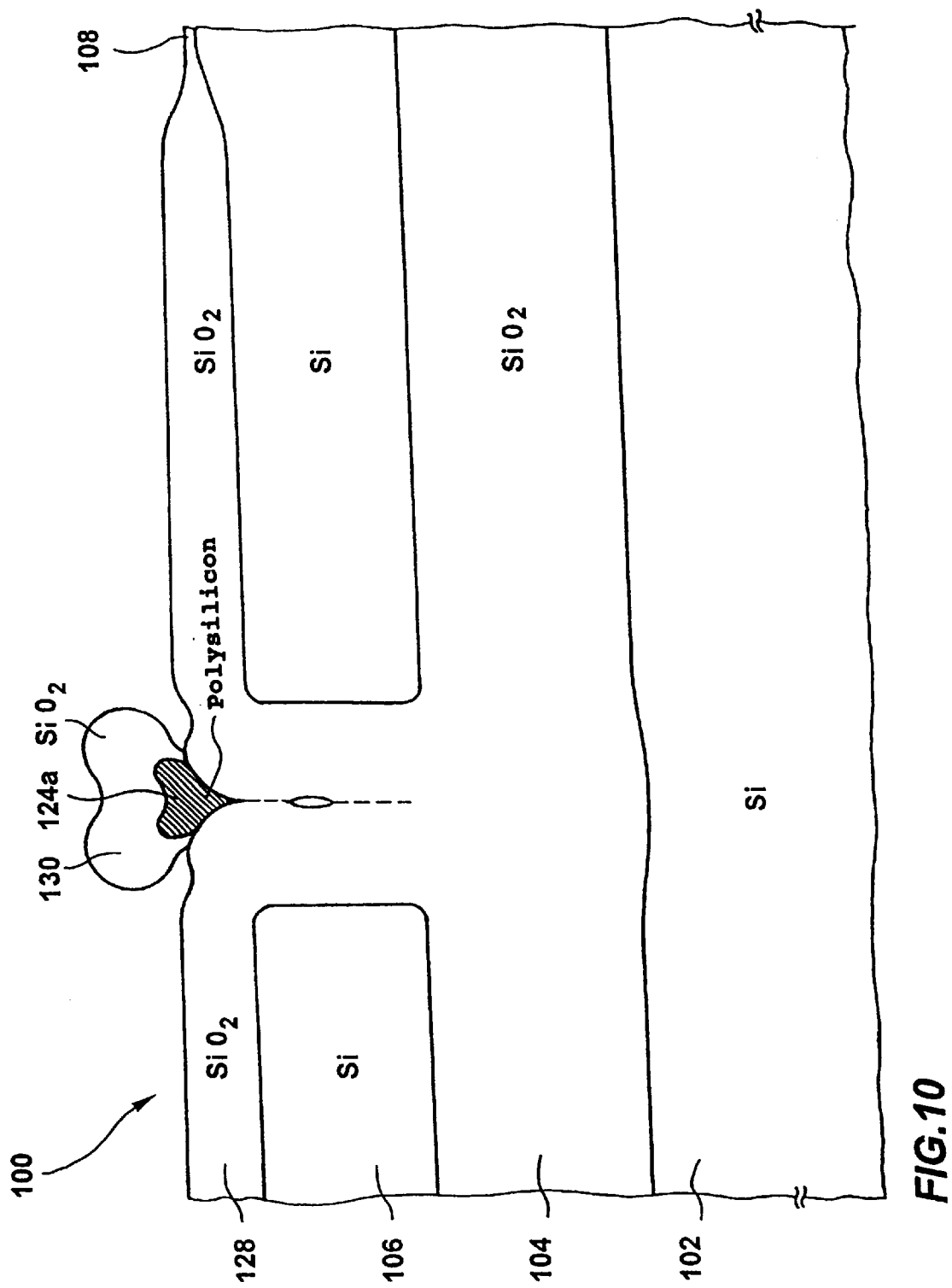
FIG. 10 shows the semiconductor substrate of FIG. 9 after a complete removal of the silicon nitride layer.

The production state is shown in FIG. 10. FIG. 10 also shows that also the possibly still existing $Si_3N_4$ residues (126, FIG. 9) at the edges of the trench cover 124a, 130 have been eliminated.

Subsequently, the sequence of layers 100 is carefully rinsed in deionized water.

As can be seen in FIG. 10, the pad oxide layer 108, which was protected by the nitride layer 110 during the field oxidation process in step S18, is no longer covered due to the removal of said nitride layer 110.

In a twenty-first method step S21, the prenitride oxide layer (pad oxide layer) 108 is etched. For this purpose, a predetermined layer thickness is removed uniformly from all $SiO_2$ surfaces 128, 108 in a wet-chemical immersion etching process in an etching solution containing hydrofluoric acid.

The aim is to etch in the thin oxide areas (132, FIG. 11) down to the bare monocrystalline silicon of the usable silicon layer 106.

Subsequently, careful rinsing in deionized water is carried out.

Figure 11:
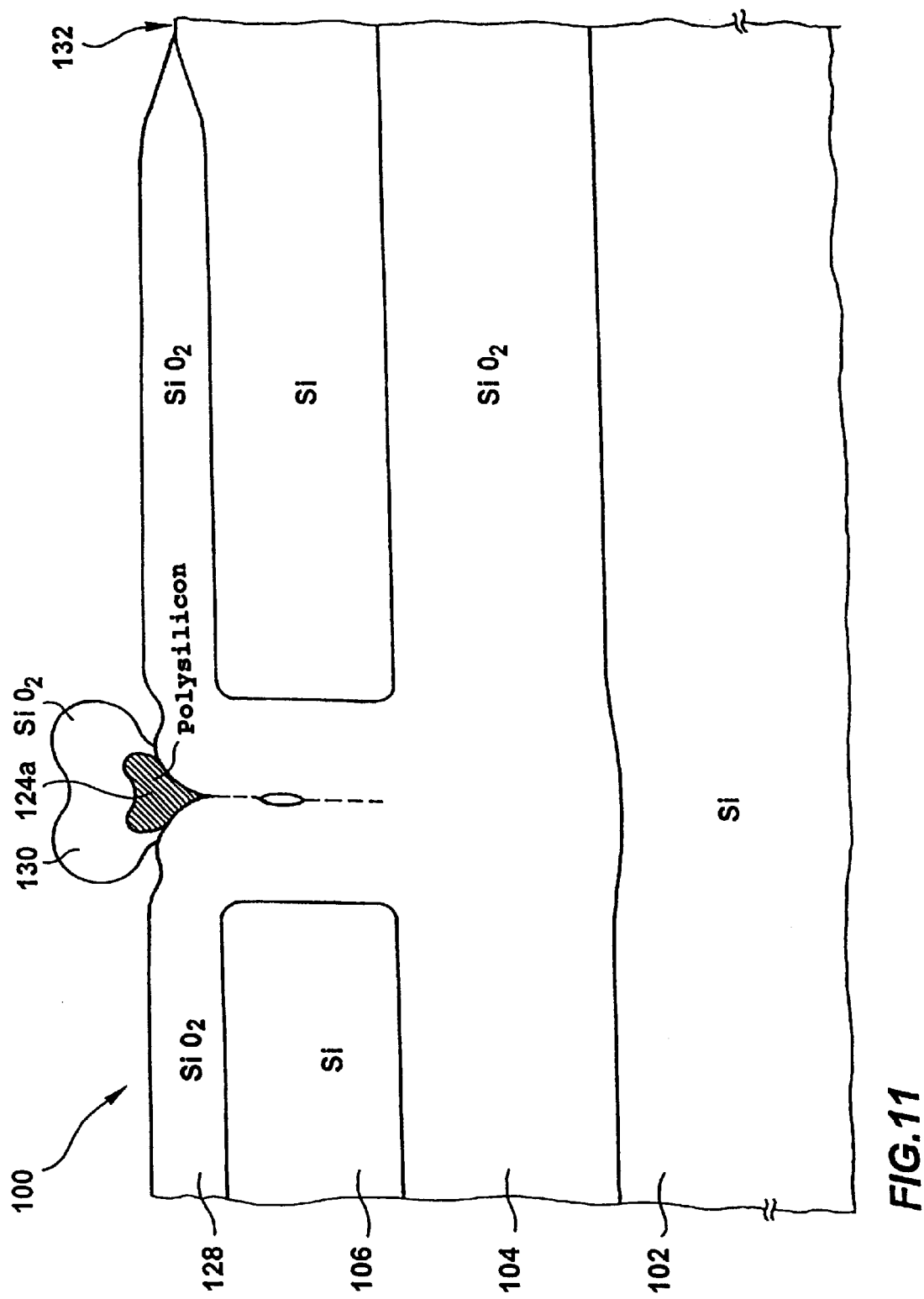
FIG. 11 shows the semiconductor substrate of FIG. 10 after removal of a predetermined thickness of the silicon oxide layer.

The production state obtained is shown in FIG. 11.

In a twenty-second method step S22, the now exposed mono-crystalline silicon layer is oxidized in a humid oxygen atmosphere at 1000° C. so as to suppress the so-called "white ribbon" artifact.

The aim is to obtain an oxide thickness of 100 nm on the bare silicon.

Figure 12:
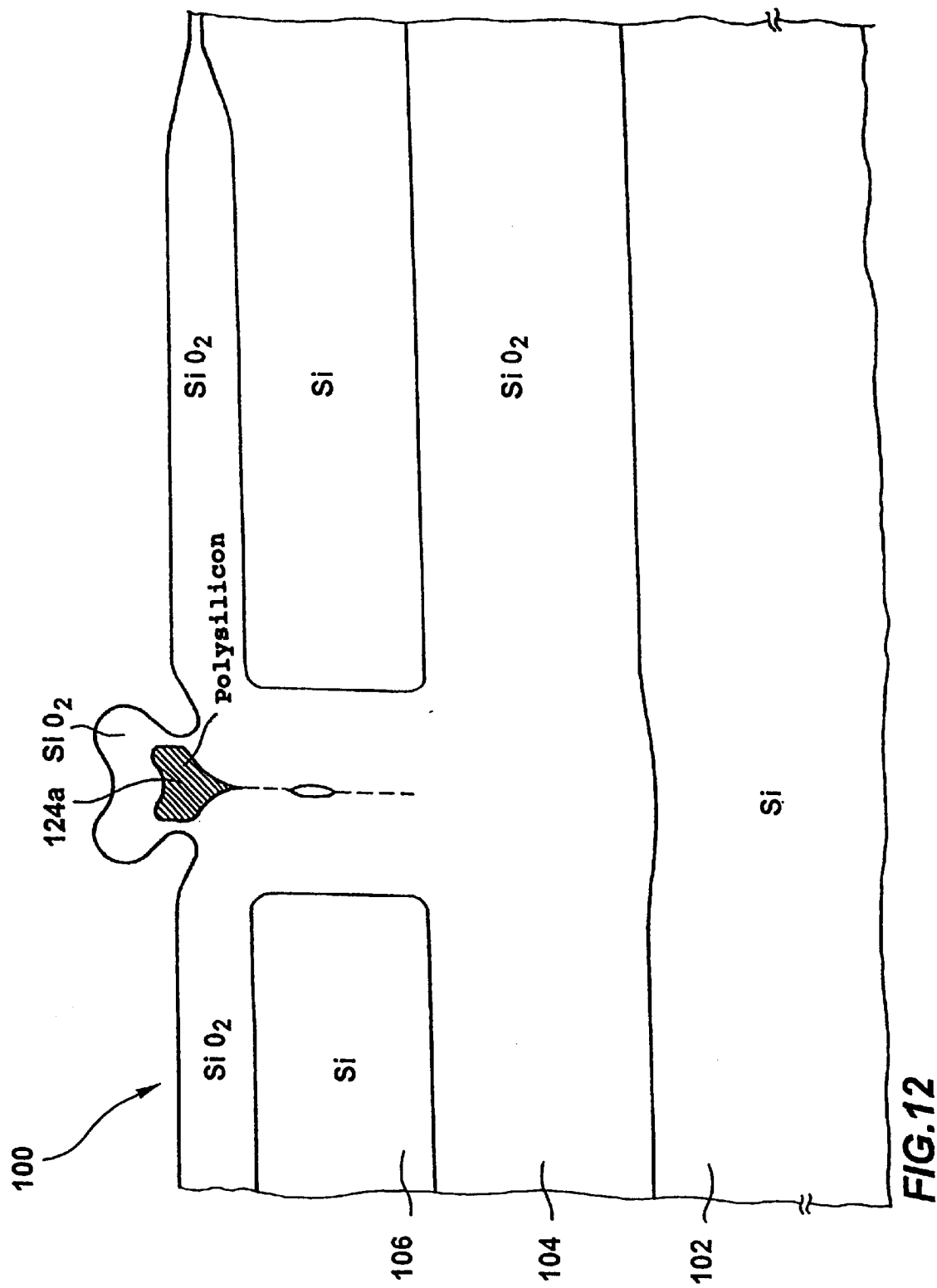
FIG. 12 shows the semiconductor substrate of FIG. 11 after oxidation in an oxygen atmosphere.

FIG. 12 shows the resultant condition, which, in principle, does not differ from the condition shown on the basis of FIG. 10.

This step is also referred to as "sacrificial oxidation step".

In a twenty-third method step S23, the "sacrificial oxide layer" is removed. This is done by removing a predetermined layer thickness from all $SiO_2$ surfaces in a wet-chemical immersion etching process in etching solutions containing hydrofluoric acid. The aim is to etch in the thin oxide area down to the bare monocrystalline silicon of the usable silicon layer 106.

The hydrophobicity of the back of the sequence of layers, which occurred at the end of the process, can be used as a monitor in said twenty-third method step.

Subsequently, careful rinsing in deionized water is carried out.

Figure 13:
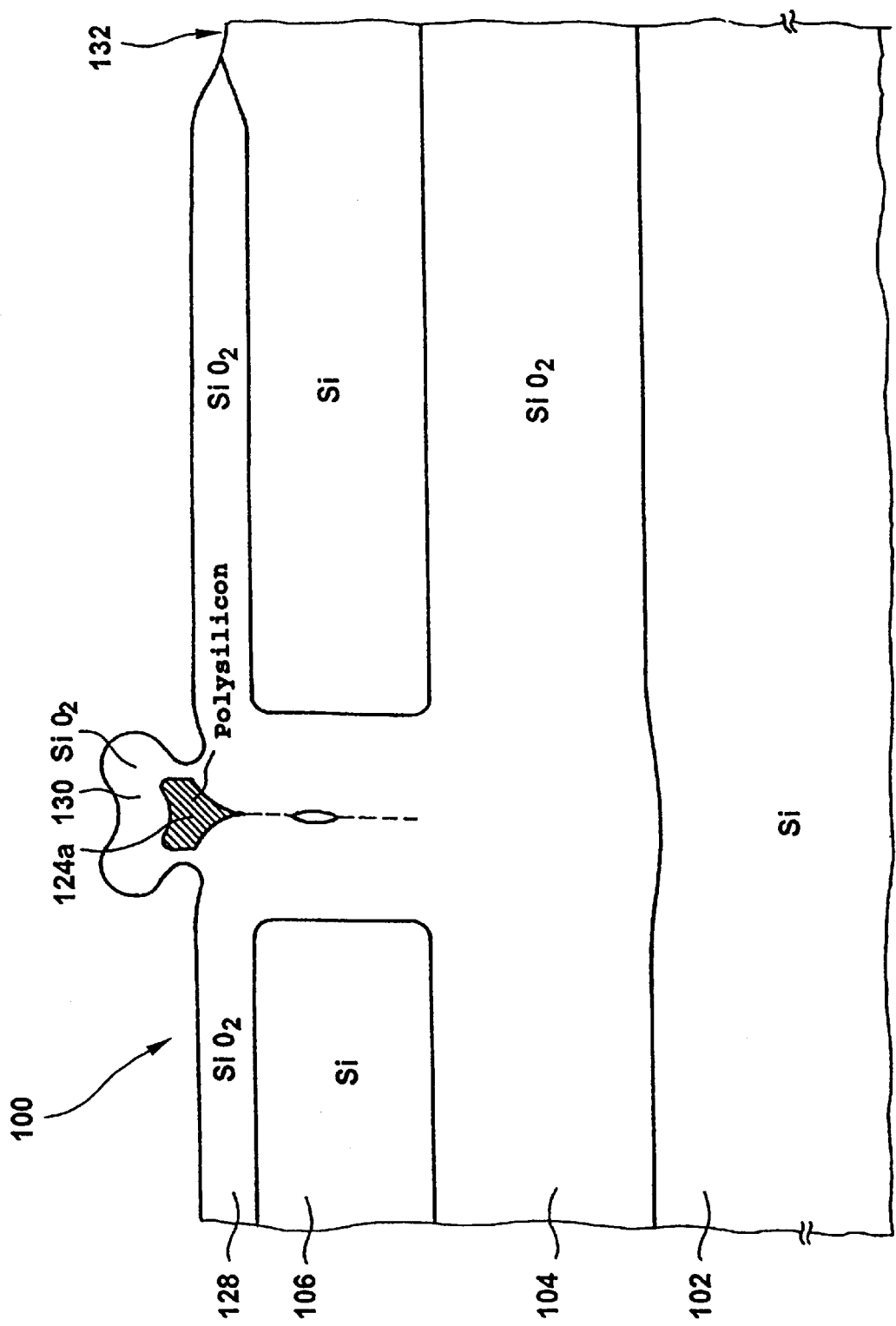
FIG. 13 shows the semiconductor substrate of FIG. 12 after removal of the oxide layer.

FIG. 13 shows the production state obtained, which, in principle, does not differ from the state shown in FIG. 11.

It is, however, pointed out that repeated etching of the whole silicon-dioxide surfaces will reduce the $SiO_2$ percentage of the trench cover.

In a twenty-fourth method step S24, a gate oxide 134 having a thickness of e.g. 55 nm is caused to grow on the exposed silicon surfaces by means of an oxidation process in a dry oxygen atmosphere at e.g. 950° C.

Figure 14:
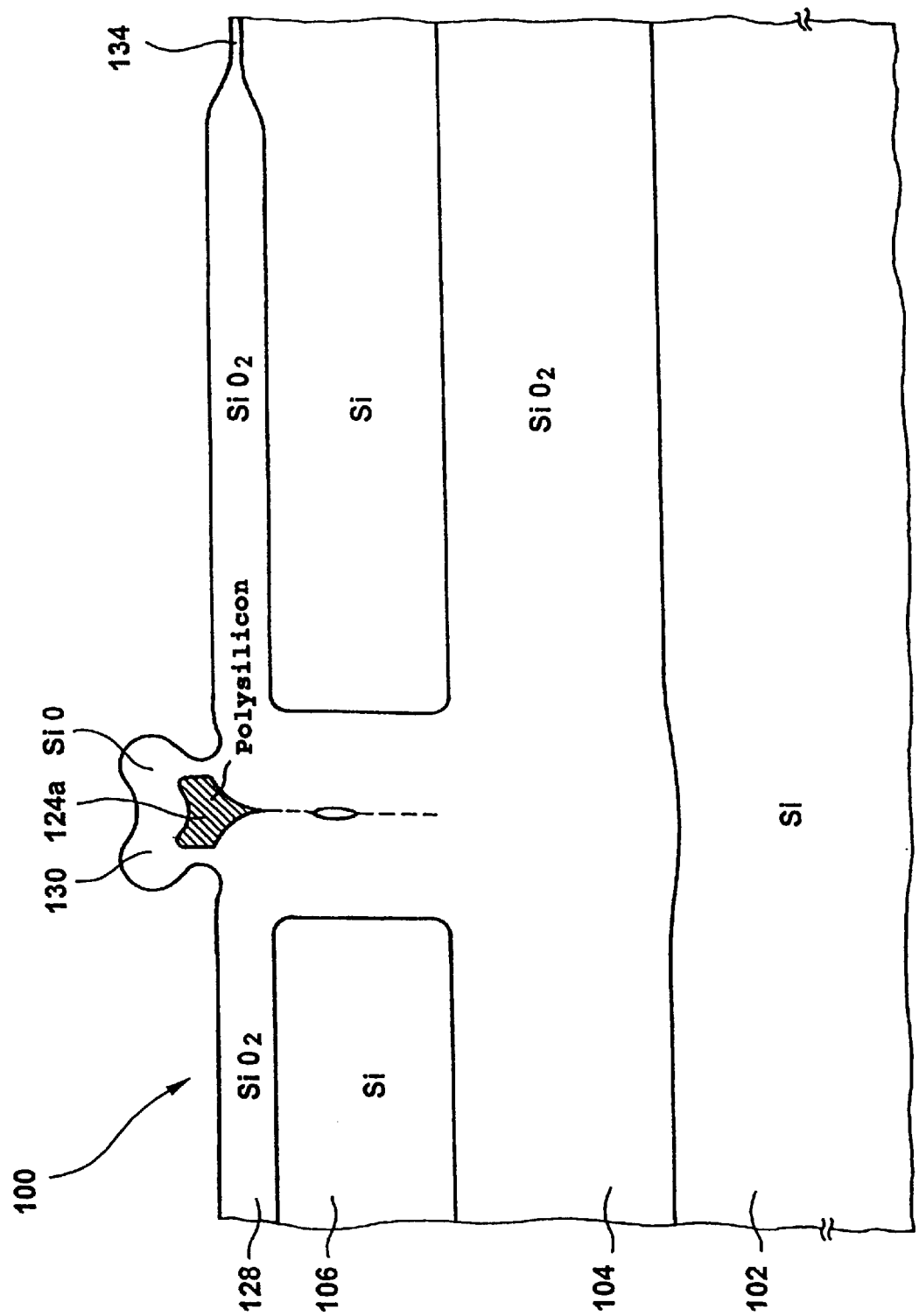
FIG. 14 shows the semiconductor substrate of FIG. 13 after growing a gate oxide on exposed silicon surfaces.

The production state, which does not differ from FIGS. 12 and 10 in a purely visual sense, is shown in FIG. 14.

In a twenty-fifth method step S25, threshold voltage implantation takes place. This implantation, which is known per se, does not have any influence on the trench. At the end, a normally 5 nm thick oxide layer is uniformly removed in a wet-chemical process in connection with the necessary cleaning steps.

In a twenty-sixth method step S26, a polysilicon layer 136 is deposited on the $SiO_2$ layer 128 and the trench cover 124a, 130 as well as on the gate oxide layer 134.

This deposition is carried out by means of the same system which has been used for depositing the first polysilicon layer 124 with the aid of a conforming LPCVD process.

Figure 15:
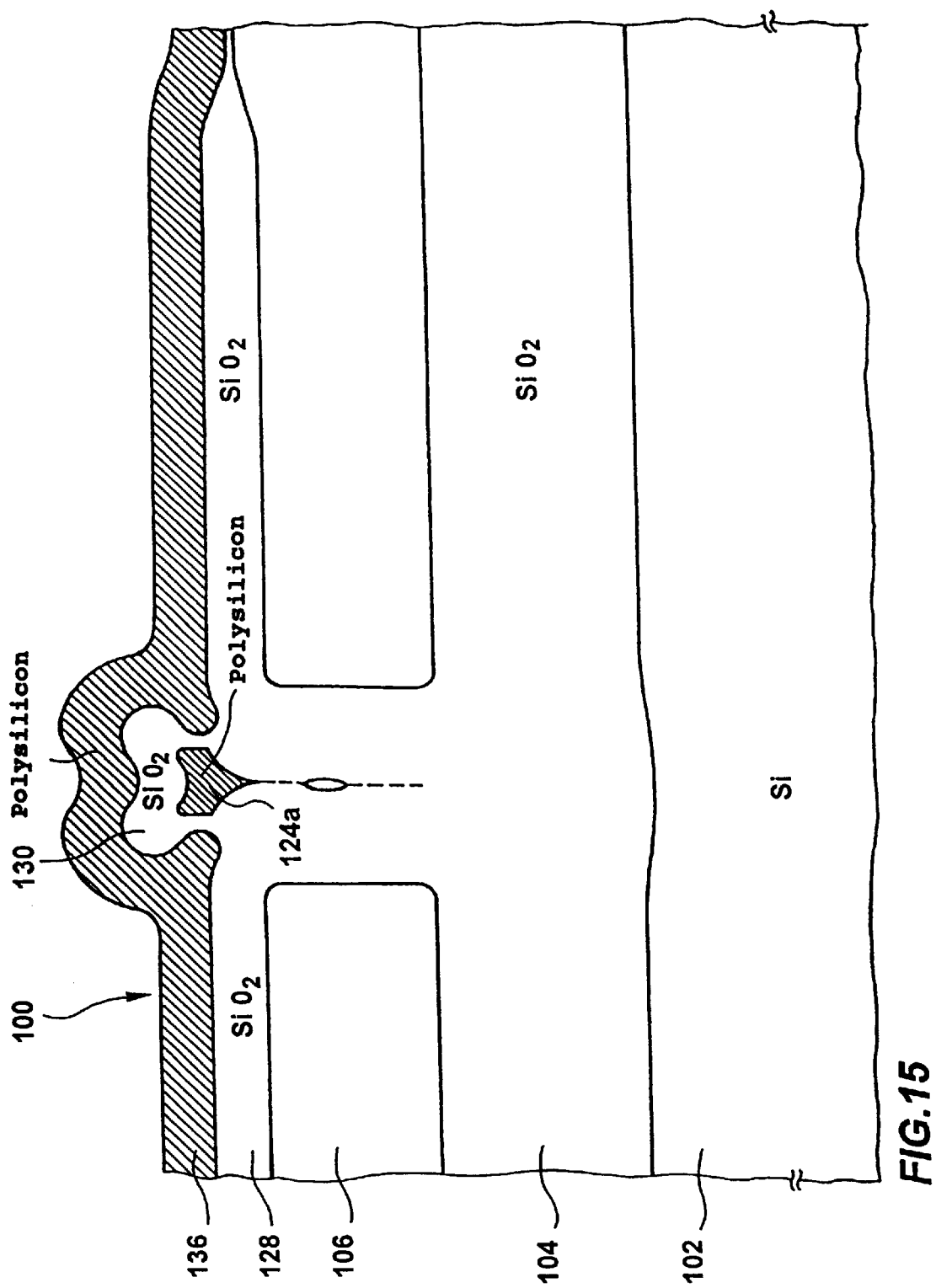
FIG. 15 shows the semiconductor substrate of FIG. 14 after deposition of a polysilicon layer.

The resultant production state is shown in FIG. 15. The conforming deposition process causes levelling of the surface of the sequence of layers 100 in the area of the edges of the trench cover.

In a twenty-seventh method step S27, the polysilicon deposited in step 26 is doped, since, after having been structured, this polysilicon serves as a gate electrode. Phosphorus doping from the gaseous phase is required for making the polysilicon layer 136 sufficiently conductive.

In a twenty-eighth method step S28, structuring of the polysilicon gate electrodes is carried out. The structuring is effected through a photoresist mask by means of the anisotropic chloroplasma dry etching process which has already been used twice in the course of the preceding process steps.

The underlying silicon dioxide layer 128 and the thin gate oxide layer 134, respectively serves as an etch stop during this dry etching process.

The selectivity of this process relative to silicon dioxide is approx. 1:20.

The process is known per se among those skilled in the art and constitutes a standard process in the field of MOS technology.

Figure 16:
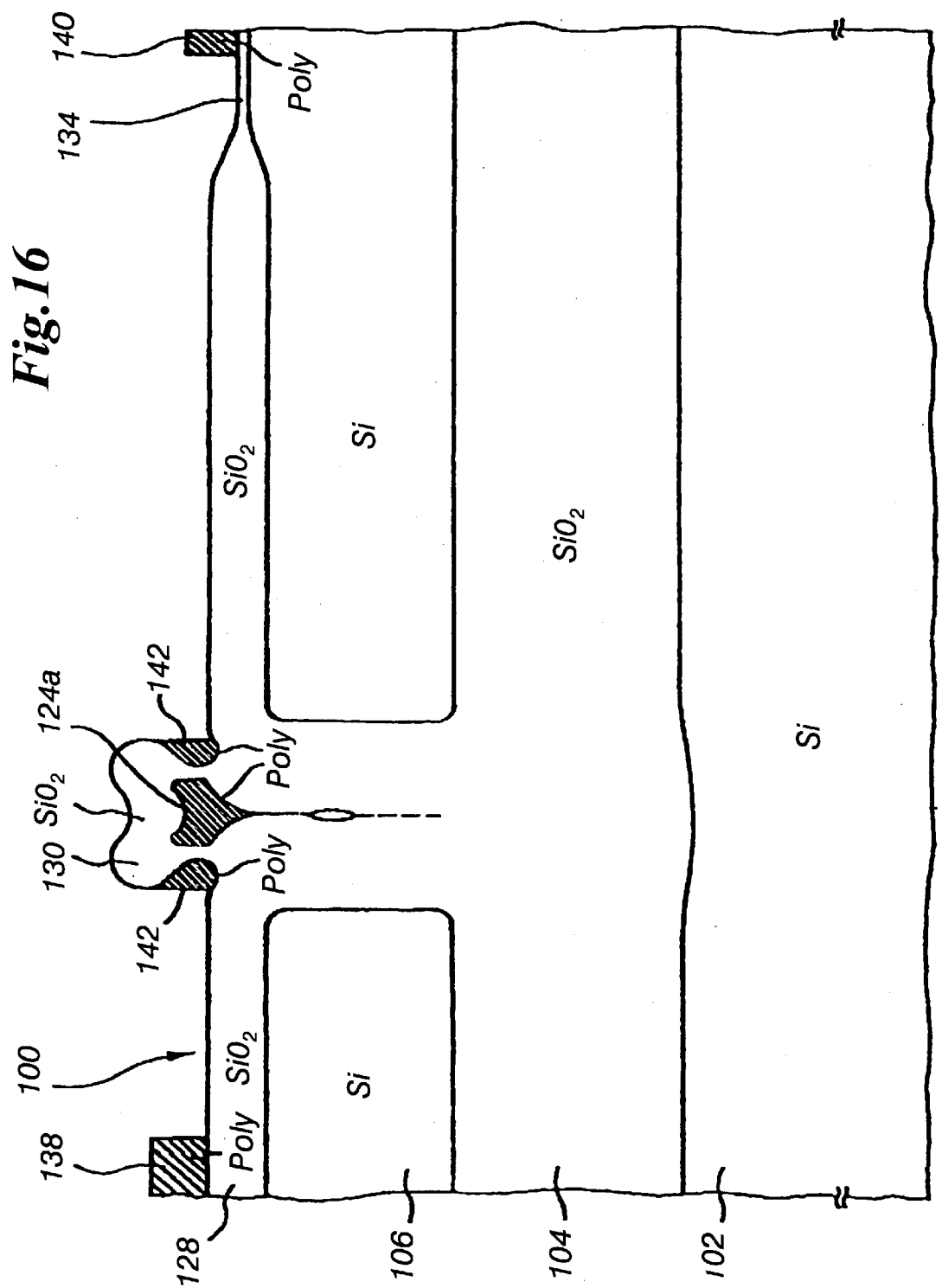
FIG. 16 shows the semiconductor substrate of FIG. 15 after doping, structuring, and etching the polysilicon layer.

FIG. 16 shows the resultant production state.

On the left-hand side, part of a polysilicon conducting path 138 on field oxide is shown, whereas on the right-hand side a gate electrode 140 on thin gate oxide 134 is shown.

In the middle, the effect which this step S28 has on the shape of the trench cover can be seen. The drawing is true to scale with regard to the layer thickness and the lateral dimensions in the trench area. It can be seen that the topography in the area of the trench cover shows differences in height which are only slightly larger than those in the areas of the gates and polysilicon conducting paths. The topography in the two last-mentioned areas is known per se and all the manufacturers of semiconductors must tolerate it, or they rather have to take appropriate levelling measures so to facilitate the subsequent process steps.

As can be seen from FIG. 16, a part 142 of the polysilicon layer 138 deposited in step S26 also remains in the area of the trench cover.

A twenty-ninth method step S29 deals with the production of source-drain regions or with source-drain technology in general.

In this step, a plurality of resist implantation maskings, ion implantations and intermediate cleaning and oxidation steps, and, if desired, also a spacer technology for producing the n- and p-source/-drain islands and the ohmic contacts to the global n- and p-doped regions, are carried out.

Figure 17:
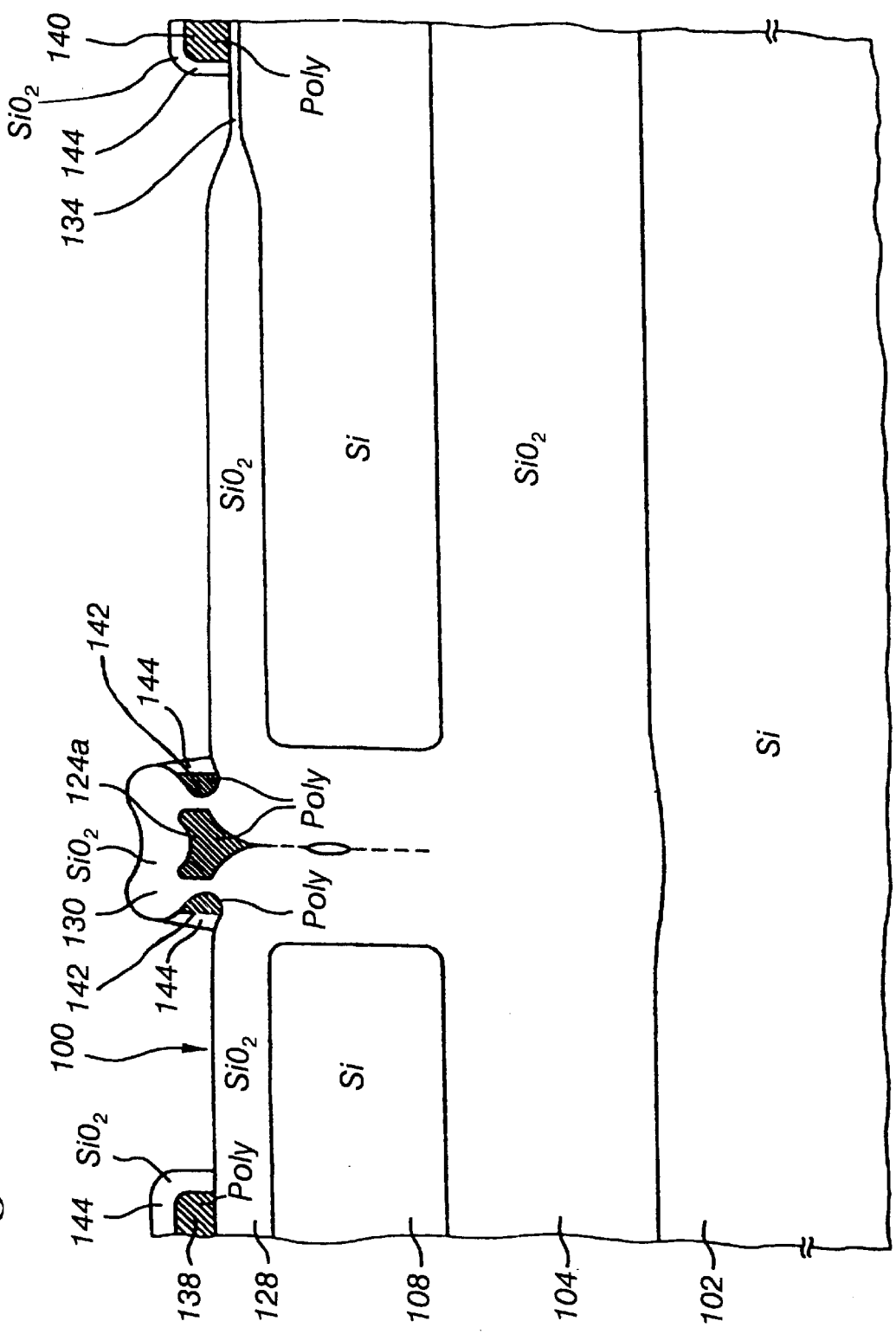
FIG. 17 shows the semiconductor substrate of FIG. 16 after the production of source/drain regions.

The effects, with the exception of the doping profiles produced, are shown in FIG. 17.

It can only be seen that the polysilicon areas 138, 140, 142 underwent thermal oxidation on the basis of which an oxide layer 144 grew.

In a thirtieth method step S30, an intermediate insulator is deposited and levelling is caused by flow distribution of said intermediate insulator.

In addition to the thermal oxide layer 144 which is already present on the polysilicon layer 138, 140, 142, an additional intermediate insulator, first an undoped deposited oxide layer, e.g. the deposited oxide layer used as a hard mask at the beginning, and subsequently an $SiO_2$ (PBSG) doped with phosphorus and boron in the percent range, is deposited from the gaseous phase.

Figure 18:
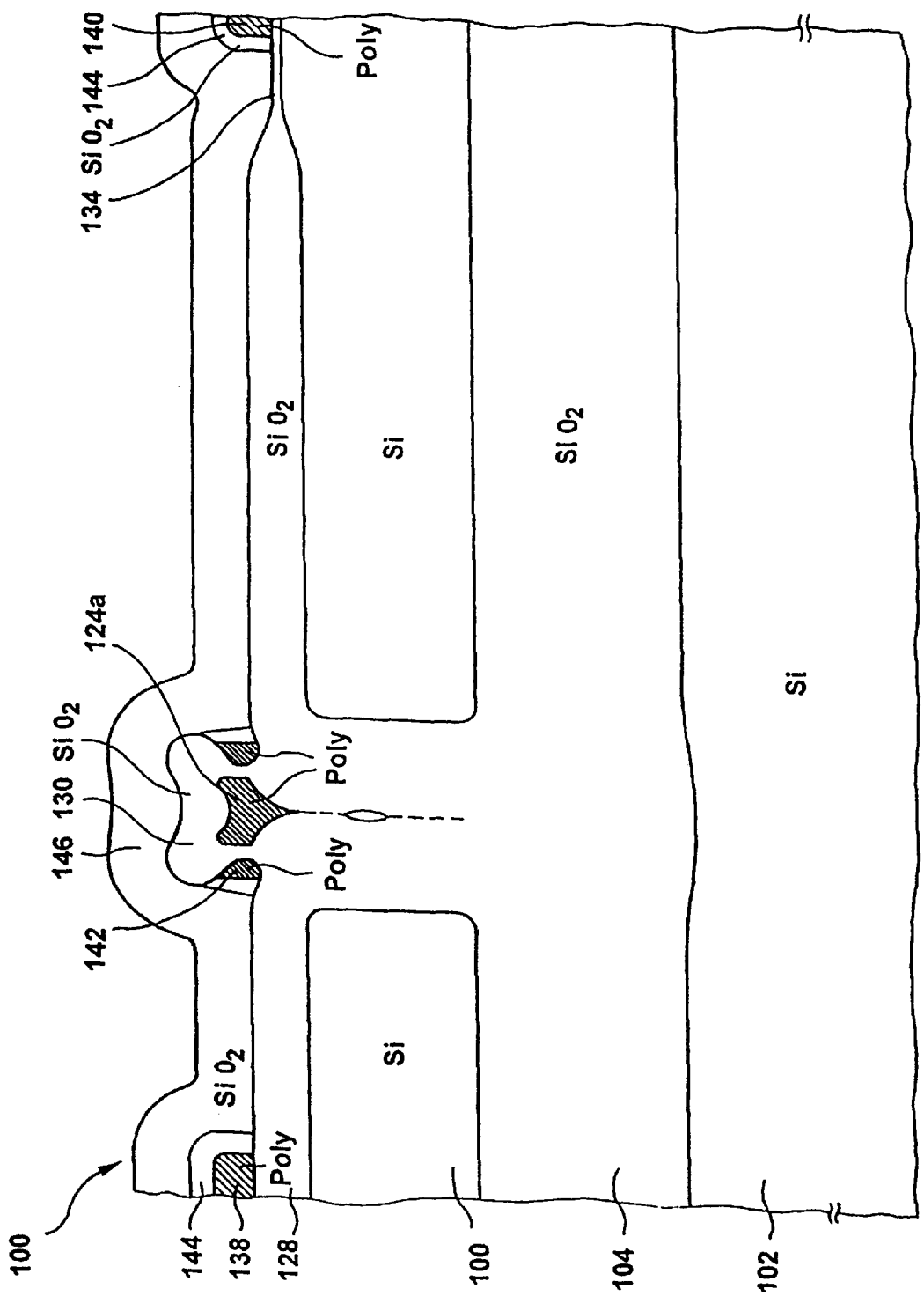
FIG. 18 shows the final semiconductor substrate.

The PBSG 146 can make the steep flanks of the polysilicon edge less steep in a flow-distribution step at a temperature of e.g. 900° C. (Cf. FIG. 18).

This will make the side walls of the trench cover less steep so that the subsequent opening of contact holes and the so-called process "back end" can fully be carried out in the manner known per se among those skilled in the art.

It is pointed out that the method described hereinbefore is a preferred embodiment of the present invention.

The method steps which are essential to the method according to the present invention do, however, not include all the above-mentioned method steps.

According to the first embodiment, the method according to the present invention comprises essentially the method step S7 in the course of which a first oxide layer 112 is deposited on the front of a sequence of layers 100 including the SOI substrate (cf. FIG. 1); the method steps S8 to S10 in the course of which the first oxide layer 112 is structured so as to define a mask for a subsequent production of a trench (FIG. 1); the method step S11 in the course of which a trench is etched down to the oxide layer of the SOI substrate making use of the mask (FIG. 1); the method step S12 in the course of which the trench 114 is filled with an oxide (FIG. 2); the method step S13 in the course of which a first polysilicon layer 124 is deposited on the first oxide layer 112 and on the oxide-filled trench 114 (cf. FIG. 4); the method step S15 in the course of which the first polysilicon layer 124 is removed in such a way that a polysilicon cover 124a remains on the oxide-filled trench 114; and the method step S16 in the course of which the first oxide layer 112 is removed (cf. FIG. 7).

Reference is also made to the fact that, although the preferred embodiment of the present invention uses a so-called BESOI substrate, it is also possible to use SOI substrates that have been produced by means of other methods.

In the following, further preferred embodiments of the present invention, which differ from the first preferred embodiment with regard to some method steps, will be described in detail.

In accordance with a second preferred embodiment of the present invention, the method steps S4 to S6 for removing the nitride layer from the back of the sequence of layers 100 are carried out as follows hereinbelow.

In connection with this embodiment, the oxide layer deposited in step S3 is used as an etching mask for the nitride of the nitride layer 110 to be protected on the front surface of the sequence of layers 100.

In a step 4.1, the front surface of the sequence of layers 100 has a resist applied thereto and the deposited oxide layer on the back of the sequence of layers 100 is removed by immersion in an etching solution containing hydrofluoric acid.

In a method step S4.2, the resist on the front surface is removed and the nitride layer on the back is removed by immersion into hot phosphoric acid, the deposited oxide layer on the front surface of the sequence of layers 100 acting as an etching mask during this step.

In a method step S4.3, the sequence of layers 100 is rinsed with deionized water and in the subsequent method step S4.4 phosphorus-contaminated oxides on the front and on the back of the sequence of layers 100 are removed in an etching solution containing hydrofluoric acid.

Subsequently, renewed rinsing with deionized water takes place in a method step S4.5, and the sequence of layers 100 is cleaned in a method step S4.6. In a method step S4.7, renewed rinsing with deionized water and drying of the sequence of layers 100 are carried out.

In the final method step 4.8, the sequence of layers 100 is tempered at 750° C. so as to remove adsorbed water molecules.

According to a third embodiment of the present invention, the method steps following hereinbelow are carried out instead of the method steps S3 to S6.

In a method step S3', the back of the sequence of layers 100 is etched in a modern spin-etching machine, e.g. an RST 100, RST 200 of SEZ.

Finally, the sequence of layers 100 is tempered at 750° C. in a method step S4' so as to remove adsorbed water molecules.

According to a fourth embodiment of the present invention, the method step S14 in the course of which the polysilicon layer on the back of the sequence of layers 100 is removed over the whole area is carried out by wet-chemical back etching on a modern spin-etching machine.

The present invention is, however, not limited to the use of SOI substrates. On the contrary, the invention is also applicable to simple substrates, i.e. in a so-called bulk material.

In the following, a fifth embodiment will be described briefly; according to said embodiment, a trench insulation is produced in a simple substrate. The method according to the fifth embodiment differs from that of the first embodiment essentially insofar as a simple substrate is used instead of an SOI substrate, the trench having a predetermined depth being etched into said simple substrate.

In accordance with said fifth embodiment, the method according to the present invention comprises essentially the following method steps:

in a first method step, a first oxide layer is deposited on a front surface of a sequence of layers including the substrate. Following this, the first oxide layer is structured so as to define a mask for the subsequent production of a trench. When the mask has been defined, a trench is etched into the substrate making use of the mask, said trench having a predetermined depth. The depth of the etched trench is adjusted e.g. by the duration of the etching process or by controlling other parameters of the etching process, this being known per se among those skilled in the art. When the trench has been etched, it is filled with an oxide and a first polysilicon layer is deposited on said first oxide layer and on the oxide-filled trench. Following this, the first polysilicon layer is removed in such a way that a polysilicon cover remains on the oxide-filled trench. Finally, the first oxide layer is removed.

The method according to the fifth embodiment results in a trench insulation which permits the active components to be arranged in closer relationship with one another, i.e. to be packed more closely, than this would be possible in the case of the so-called LOCOS insulation. Furthermore, the insulating properties obtained when the method according to the present invention is used are better than those obtained in the case of LOCOS insulation.

The trench insulation according to the fifth embodiment is used e.g. in the field of 256-megabit or larger DRAMs and for logic processes that can be derived from these memories.

What is claimed is:

1. A method of producing a trench insulation in a silicon substrate, said silicon substrate having a first main surface and a second main surface, comprising the following steps;
    a) depositing a first silicon-oxide layer, a first silicon nitride layer, and a second silicon-oxide layer in this order on the first main surface of the silicon substrate;
    b) structuring the first silicon-oxide layer, the first silicon nitride layer, and the second silicon-oxide layer so as to define a mask for a subsequent formation of a trench;
    c) etching a trench in the silicon substrate making use of said mask;
    d) filling said trench by a local oxidation of silicon ("LOCOS") process by subjecting the structure formed by step (a) to (c) to an oxidation in a thermal oxidation process for growing on the trench walls silicon oxide layers until the silicon oxide layers grown on the trench wall contact each other, thereby completely filling the trench with a silicon oxide;
    e) conforming deposition of a first polysilicon layer on the second silicon-oxide layer and on the oxide-filled trench;
    f) removing said first polysilicon layer in such a way that a polysilicon cover remains on said oxide-filled trench; and
    g) removing the second silicon-oxide layer.

2. The method according to claim 1, wherein the silicon substrate is an SOI substrate, and in step c) etching of the trench is effected down to an insulating layer of the SOI substrate.

3. The method according to claim 1, wherein the trench is etched by means of a chloroplasma dry etching process.

4. The method according to claim 1, wherein the second silicon-oxide layer is deposited by a TEOS LPCVD process.

5. The method according to claim 1, wherein the first polysilicon layer is deposited by means of an LPCVD process.

6. The method according to claim 1, wherein the first polysilicon layer is removed by means of an etching process.

7. The method according to claim 1, wherein the second silicon-oxide layer is removed by a wet-chemical etching process.

8. A method of producing a trench insulation in a SOL, said SOI having a first main surface and a second main surface, comprising the following steps:
    a) depositing a first silicon-oxide layer, a first silicon nitride layer, and a second silicon-oxide layer in this order on the first main surface of the SOL substrate;
    b) structuring the first silicon-oxide layer, the first silicon nitride layer, and the second silicon-oxide layer so as to define a mask for a subsequent formation of a trench;
    c) etching a trench down to an insulating layer of the SOI substrate making use of said mask;
    d) filling said trench by a local oxidation of silicon ("LOCOS")process by subjecting the structure formed by step (a) to (c) to an oxidation in a thermal oxidation process for growing on the trench walls silicon oxide layers until the silicon oxide layers grown on the trench wall contact each other, thereby completely filling the trench with a silicon oxide;
    e) conforming deposition of a first polysilicon layer on the second silicon-oxide layer and on the oxide-filled trench;
    f) removing said first polysilicon layer in such a way that a polysilicon cover remains on said oxide-filled trench; and
    g) removing the second silicon-oxide layer.

9. A method of producing a trench insulation in a silicon substrate, said silicon substrate having a first main surface and a second main surface, comprising the following steps;
    a) depositing a first silicon-oxide layer, a first silicon nitride layer, and a second silicon-oxide layer in this order on the first main surface of the silicon substrate;
    b) structuring the first silicon-oxide layer, the first silicon nitride layer, and the second silicon-oxide layer so as to define a mask for a subsequent formation of a trench;
    c) etching a trench in the silicon substrate making use of said mask;
    d) filling said trench by a local oxidation of silicon ("LOCOS") process by subjecting the structure formed by steps (a) to (c) to an process selected from the group consisting of:
        filling said trench by CVD oxide deposition; or
        filling said trench partially by thermal oxidation and filling the remainder of said trench by CVD oxide deposition;
    thereby completely filling the trench with a silicon oxide;
    e) conforming deposition of a first polysilicon layer on the second silicon-oxide layer and on the oxide-filled trench;
    f) removing said first polysilicon layer in such a way that a polysilicon cover remains on said oxide-filled trench; and
    g) removing the second silicon-oxide layer.

* * * * *